(12) United States Patent
Koyama

(10) Patent No.: US 11,296,120 B2
(45) Date of Patent: Apr. 5, 2022

(54) SHIFT REGISTER AND DISPLAY DEVICE AND DRIVING METHOD THEREOF

(71) Applicant: Semiconductor Energy Laboratory Co., Ltd., Atsugi (JP)

(72) Inventor: Jun Koyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/806,418

(22) Filed: Nov. 8, 2017

(65) Prior Publication Data

US 2018/0061866 A1 Mar. 1, 2018

Related U.S. Application Data

(63) Continuation of application No. 14/010,843, filed on Aug. 27, 2013, now abandoned, which is a (Continued)

(30) Foreign Application Priority Data

Oct. 9, 2009 (JP) ................................. 2009-234845

(51) Int. Cl.
*H01L 27/12* (2006.01)
*G09G 3/3266* (2016.01)
(Continued)

(52) U.S. Cl.
CPC ....... *H01L 27/1225* (2013.01); *G09G 3/3266* (2013.01); *G09G 3/3677* (2013.01);
(Continued)

(58) Field of Classification Search
CPC .............. H01L 27/1225; G09G 3/3266; G09G 3/3677; G09G 2300/0408;
(Continued)

(56) References Cited

U.S. PATENT DOCUMENTS 5,053,347 A 10/1991 Wu
5,079,606 A 1/1992 Yamamura et al.
(Continued)

FOREIGN PATENT DOCUMENTS

CN 001518221 A 8/2004
CN 001959848 A 5/2007
(Continued)

OTHER PUBLICATIONS

Taiwanese Office Action (Application No. 105120962) dated Oct. 17, 2017.
(Continued)

*Primary Examiner* — Mohammad M Hoque
(74) *Attorney, Agent, or Firm* — Fish & Richardson P.C.

(57) ABSTRACT

The power consumption of a shift register or a display device including the shift register is reduced. A clock signal is supplied to a shift register by a plurality of wirings, not by one wiring. Any one of the plurality of wirings supplies a clock signal in only part of the operation period of the shift register, not during the whole operation period of the shift register. Therefore, the capacity load caused with the supply of clock signals can be reduced, leading to reduction in power consumption of the shift register.

10 Claims, 22 Drawing Sheets

Related U.S. Application Data continuation of application No. 12/897,360, filed on Oct. 4, 2010, now Pat. No. 8,526,567.

(51) Int. Cl.
*G09G 3/36* (2006.01)
*G11C 19/28* (2006.01)

(52) U.S. Cl.
CPC ..... *G11C 19/28* (2013.01); *G09G 2300/0408* (2013.01); *G09G 2300/0417* (2013.01); *G09G 2310/0267* (2013.01); *G09G 2330/021* (2013.01)

(58) Field of Classification Search
CPC ..... G09G 2310/0267; G09G 2330/021; G09G 2300/0417; G11C 19/28
USPC .......................................................... 257/43
See application file for complete search history.

(56) References Cited

U.S. PATENT DOCUMENTS

| | | |
|---|---|---|
| 5,136,622 A | 8/1992 | Plus |
| 5,410,583 A | 4/1995 | Weisbrod et al. |
| 5,731,856 A | 3/1998 | Kim et al. |
| 5,744,864 A | 4/1998 | Cillessen et al. |
| 5,757,028 A | 5/1998 | Sasaki et al. |
| 6,294,274 B1 | 9/2001 | Kawazoe et al. |
| 6,417,829 B1 | 7/2002 | Jung et al. |
| 6,563,174 B2 | 5/2003 | Kawasaki et al. |
| 6,690,347 B2 | 2/2004 | Jeon et al. |
| 6,727,522 B1 | 4/2004 | Kawasaki et al. |
| 6,813,332 B2 | 11/2004 | Nagao et al. |
| 6,845,140 B2 | 1/2005 | Moon et al. |
| 6,963,327 B2 | 11/2005 | Kawahata et al. |
| 6,975,142 B2 | 12/2005 | Azami et al. |
| 7,049,190 B2 | 5/2006 | Takeda et al. |
| 7,057,598 B2 | 6/2006 | Azami et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,116,748 B2 | 10/2006 | Nagao et al. |
| 7,211,825 B2 | 5/2007 | Shih et al. |
| 7,282,782 B2 | 10/2007 | Hoffman et al. |
| 7,289,096 B2 | 10/2007 | Jeon et al. |
| 7,297,977 B2 | 11/2007 | Hoffman et al. |
| 7,323,356 B2 | 1/2008 | Hosono et al. |
| 7,324,123 B2 | 1/2008 | Yamazaki et al. |
| 7,369,111 B2 | 5/2008 | Jeon et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| RE40,673 E | 3/2009 | Kanbara et al. |
| 7,501,293 B2 | 3/2009 | Ito et al. |
| 7,511,709 B2 | 3/2009 | Koyama et al. |
| 7,586,478 B2 | 9/2009 | Azami et al. |
| 7,656,194 B2 | 2/2010 | Shin |
| 7,674,650 B2 | 3/2010 | Akimoto et al. |
| 7,687,808 B2 | 3/2010 | Umezaki |
| 7,696,974 B2 | 4/2010 | Moon et al. |
| 7,710,384 B2 | 5/2010 | Azami et al. |
| 7,732,251 B2 | 6/2010 | Hoffman et al. |
| 7,732,819 B2 | 6/2010 | Akimoto et al. |
| 7,843,421 B2 | 11/2010 | Chang et al. |
| 7,859,510 B2 | 12/2010 | Umezaki |
| 7,863,611 B2 | 1/2011 | Abe et al. |
| 7,964,876 B2 | 6/2011 | Umezaki |
| 7,978,274 B2 | 7/2011 | Umezaki et al. |
| 8,023,610 B2 | 9/2011 | Miyayama et al. |
| 8,031,158 B2 | 10/2011 | Jang et al. |
| 8,129,717 B2 | 3/2012 | Yamazaki et al. |
| 8,133,749 B2 | 3/2012 | Eguchi |
| 8,143,115 B2 | 3/2012 | Omura et al. |
| 8,148,721 B2 | 4/2012 | Hayashi et al. |
| 8,164,152 B2 | 4/2012 | Lee et al. |
| 8,164,256 B2 | 4/2012 | Sano et al. |
| 8,203,144 B2 | 6/2012 | Hoffman et al. |
| 8,203,146 B2 | 6/2012 | Abe et al. |
| 8,207,014 B2 | 6/2012 | Sasaki et al. |
| 8,207,531 B2 | 6/2012 | Takahashi et al. |
| 8,216,878 B2 | 7/2012 | Sasaki et al. |
| 8,223,289 B2 | 7/2012 | Yamazaki et al. |
| 8,242,496 B2 | 8/2012 | Yamazaki et al. |
| 8,264,445 B2 | 9/2012 | Azami et al. |
| 8,314,765 B2 | 11/2012 | Umezaki |
| 8,324,027 B2 | 12/2012 | Yamazaki et al. |
| 8,330,492 B2 | 12/2012 | Umezaki |
| 8,343,817 B2 | 1/2013 | Miyairi et al. |
| 8,378,343 B2 | 2/2013 | Yamazaki et al. |
| 8,389,326 B2 | 3/2013 | Sasaki et al. |
| 8,394,671 B2 | 3/2013 | Sasaki et al. |
| 8,415,198 B2 | 4/2013 | Itagaki et al. |
| 8,441,011 B2 | 5/2013 | Yamazaki et al. |
| 8,445,905 B2 | 5/2013 | Yamazaki et al. |
| 8,456,396 B2 | 6/2013 | Umezaki |
| 8,462,100 B2 | 6/2013 | Umezaki |
| 8,477,085 B2 | 7/2013 | Shishido |
| 8,502,217 B2 | 8/2013 | Sato et al. |
| 8,513,054 B2 | 8/2013 | Sasaki et al. |
| 8,518,740 B2 | 8/2013 | Yamazaki et al. |
| 8,520,159 B2 | 8/2013 | Umezaki et al. |
| 8,526,567 B2 | 9/2013 | Koyama |
| 8,541,944 B2 | 9/2013 | Sano et al. |
| 8,557,641 B2 | 10/2013 | Sasaki et al. |
| 8,566,502 B2 | 10/2013 | Vaghani |
| 8,598,591 B2 | 12/2013 | Umezaki |
| 8,609,478 B2 | 12/2013 | Sasaki et al. |
| 8,623,698 B2 | 1/2014 | Sasaki et al. |
| 8,629,441 B2 | 1/2014 | Yamazaki et al. |
| 8,643,586 B2 | 2/2014 | Umezaki |
| 8,647,031 B2 | 2/2014 | Hoffman et al. |
| 8,697,488 B2 | 4/2014 | Sasaki et al. |
| 8,742,422 B2 | 6/2014 | Sakakura et al. |
| 8,774,347 B2 | 7/2014 | Umezaki |
| 8,785,240 B2 | 7/2014 | Watanabe |
| 8,786,533 B2 | 7/2014 | Azami et al. |
| 8,798,226 B2 | 8/2014 | Nagao et al. |
| 8,803,781 B2 | 8/2014 | Kimura et al. |
| 8,835,920 B2 | 9/2014 | Yamazaki et al. |
| 8,846,460 B2 | 9/2014 | Sasaki et al. |
| 8,878,172 B2 | 11/2014 | Ito et al. |
| 8,900,916 B2 | 12/2014 | Yamazaki et al. |
| 8,908,115 B2 | 12/2014 | Umezaki et al. |
| 8,945,981 B2 | 2/2015 | Yamazaki et al. |
| 9,036,767 B2 | 5/2015 | Umezaki |
| 9,054,137 B2 | 6/2015 | Sasaki et al. |
| 9,054,138 B2 | 6/2015 | Yamazaki et al. |
| 9,070,593 B2 | 6/2015 | Umezaki |
| 9,105,520 B2 | 8/2015 | Azami et al. |
| 9,111,806 B2 | 8/2015 | Ito et al. |
| 9,136,115 B2 | 9/2015 | Sasaki et al. |
| 9,136,389 B2 | 9/2015 | Yamazaki et al. |
| 9,202,851 B2 | 12/2015 | Yamazaki et al. |
| 9,214,473 B2 | 12/2015 | Umezaki |
| 9,263,468 B2 | 2/2016 | Umezaki et al. |
| 9,311,876 B2 | 4/2016 | Umezaki |
| 9,461,071 B2 | 10/2016 | Umezaki |
| 9,490,277 B2 | 11/2016 | Yamazaki et al. |
| 9,606,408 B2 | 3/2017 | Umezaki et al. |
| 9,647,137 B2 | 5/2017 | Ito et al. |
| 9,666,719 B2 | 5/2017 | Yamazaki et al. |
| 9,754,974 B2 | 9/2017 | Yamazaki et al. |
| 10,048,558 B2 | 8/2018 | Umezaki et al. |
| 10,326,025 B2 | 6/2019 | Yamazaki et al. |
| 2001/0046027 A1 | 11/2001 | Tai et al. |
| 2002/0014624 A1 | 2/2002 | Yamazaki et al. |
| 2002/0056838 A1 | 5/2002 | Ogawa |
| 2002/0089476 A1 | 7/2002 | Kang |

(56) References Cited

U.S. PATENT DOCUMENTS

| | | |
|---|---|---|
| 2002/0132454 A1 | 9/2002 | Ohtsu et al. |
| 2002/0158829 A1 | 10/2002 | Yamazaki et al. |
| 2002/0167026 A1 | 11/2002 | Azami et al. |
| 2002/0180369 A1 | 12/2002 | Koyama |
| 2003/0001800 A1 | 1/2003 | Nakajima et al. |
| 2003/0047785 A1 | 3/2003 | Kawasaki et al. |
| 2003/0189401 A1 | 10/2003 | Kido et al. |
| 2003/0206608 A1 | 11/2003 | Kawahata et al. |
| 2003/0218222 A1 | 11/2003 | Wager, III et al. |
| 2003/0231735 A1 | 12/2003 | Moon et al. |
| 2004/0028172 A1 | 2/2004 | Yu |
| 2004/0038446 A1 | 2/2004 | Takeda et al. |
| 2004/0127038 A1 | 7/2004 | Carcia et al. |
| 2004/0140839 A1* | 7/2004 | Nagao ............ G11C 19/00 327/291 |
| 2004/0217935 A1 | 11/2004 | Jeon et al. |
| 2005/0017302 A1 | 1/2005 | Hoffman |
| 2005/0062515 A1 | 3/2005 | Nagao et al. |
| 2005/0199959 A1 | 9/2005 | Chiang et al. |
| 2005/0275038 A1 | 12/2005 | Shih et al. |
| 2006/0027804 A1 | 2/2006 | Yamazaki et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1* | 5/2006 | Yabuta ............ H01L 29/78693 438/151 |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0166415 A1 | 7/2006 | Afentakis et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0244391 A1 | 11/2006 | Shishido et al. |
| 2006/0244699 A1 | 11/2006 | Yamazaki |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto ............ H01L 27/1225 438/795 |
| 2007/0090365 A1 | 4/2007 | Hayashi et al. |
| 2007/0096096 A1 | 5/2007 | Kuwabara et al. |
| 2007/0096106 A1 | 5/2007 | Yamazaki et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296660 A1 | 12/2007 | Kimura et al. |
| 2008/0006877 A1 | 1/2008 | Mardilovich et al. |
| 2008/0007296 A1 | 1/2008 | Umezaki |
| 2008/0011861 A1* | 1/2008 | Ikeda ............ G06F 1/189 235/492 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0061922 A1* | 3/2008 | Nakamura ............ H01P 1/15 337/298 |
| 2008/0062112 A1 | 3/2008 | Umezaki |
| 2008/0073653 A1 | 3/2008 | Iwasaki |
| 2008/0079001 A1 | 4/2008 | Umezaki et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0187089 A1 | 8/2008 | Miyayama et al. |
| 2008/0191988 A1 | 8/2008 | Tanaka |
| 2008/0224133 A1 | 9/2008 | Park et al. |
| 2008/0246716 A1 | 10/2008 | Miyake et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0027083 A1 | 1/2009 | Kimura et al. |
| 2009/0068773 A1 | 3/2009 | Lai et al. |
| 2009/0073325 A1 | 3/2009 | Kuwabara et al. |
| 2009/0081826 A1* | 3/2009 | Cowdery-Corvan ............ C23C 16/45574 438/104 |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0167974 A1 | 7/2009 | Choi et al. |
| 2009/0184315 A1 | 7/2009 | Lee et al. |
| 2009/0206332 A1 | 8/2009 | Son et al. |
| 2009/0207153 A1 | 8/2009 | Kunii et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0322716 A1 | 12/2009 | Azami et al. |
| 2010/0044701 A1 | 2/2010 | Sano et al. |
| 2010/0045179 A1 | 2/2010 | Sano et al. |
| 2010/0051935 A1 | 3/2010 | Lee et al. |
| 2010/0065844 A1 | 3/2010 | Tokunaga |
| 2010/0072435 A1* | 3/2010 | Honda ............ H01B 1/22 252/519.51 |
| 2010/0079169 A1 | 4/2010 | Kim et al. |
| 2010/0084648 A1* | 4/2010 | Watanabe ............ H01L 27/1214 257/43 |
| 2010/0092800 A1 | 4/2010 | Itagaki et al. |
| 2010/0109002 A1 | 5/2010 | Itagaki et al. |
| 2010/0134708 A1 | 6/2010 | Kimura et al. |
| 2010/0158187 A1 | 6/2010 | Moon et al. |
| 2010/0163874 A1 | 7/2010 | Koyama et al. |
| 2010/0200843 A1* | 8/2010 | Arai ............ H01L 27/3262 257/40 |
| 2010/0244022 A1 | 9/2010 | Takahashi et al. |
| 2010/0283049 A1 | 11/2010 | Sato et al. |
| 2011/0003427 A1 | 1/2011 | Sasaki et al. |
| 2011/0003428 A1 | 1/2011 | Sasaki et al. |
| 2011/0003430 A1 | 1/2011 | Yamazaki et al. |
| 2011/0008930 A1 | 1/2011 | Sasaki et al. |
| 2011/0049509 A1 | 3/2011 | Takahashi et al. |
| 2011/0053322 A1 | 3/2011 | Sasaki et al. |
| 2011/0068829 A1 | 3/2011 | Ogawa et al. |
| 2011/0084960 A1 | 4/2011 | Miyake et al. |
| 2011/0095288 A1* | 4/2011 | Morosawa ............ H01L 29/7869 257/43 |
| 2011/0109591 A1 | 5/2011 | Kurokawa et al. |
| 2011/0122988 A1 | 5/2011 | Miyayama et al. |
| 2011/0180802 A1 | 7/2011 | Morosawa et al. |
| 2012/0061668 A1 | 3/2012 | Miyairi et al. |
| 2012/0087461 A1 | 4/2012 | Liu et al. |
| 2012/0168750 A1 | 7/2012 | Hayashi et al. |
| 2012/0205651 A1 | 8/2012 | Lee et al. |
| 2012/0295399 A1 | 11/2012 | Kim et al. |
| 2013/0251091 A1 | 9/2013 | Nagao et al. |

(56) References Cited

U.S. PATENT DOCUMENTS

| | | |
|---|---|---|
| 2013/0299821 A1 | 11/2013 | Yamazaki |
| 2013/0328044 A1 | 12/2013 | Yamazaki et al. |
| 2013/0341618 A1 | 12/2013 | Koyama |
| 2014/0073085 A1 | 3/2014 | Sasaki et al. |
| 2014/0131696 A1* | 5/2014 | Ono ................ H01L 29/66969 257/40 |
| 2014/0145187 A1 | 5/2014 | Umezaki |
| 2014/0217402 A1 | 8/2014 | Sasaki et al. |
| 2014/0334596 A1 | 11/2014 | Kimura et al. |
| 2014/0377907 A1 | 12/2014 | Sasaki et al. |
| 2015/0072470 A1 | 3/2015 | Yamazaki et al. |
| 2015/0084048 A1 | 3/2015 | Hayashi et al. |
| 2016/0190174 A1 | 6/2016 | Umezaki |
| 2017/0018576 A1 | 1/2017 | Umezaki |
| 2017/0213855 A1 | 7/2017 | Ito et al. |
| 2017/0236943 A1 | 8/2017 | Yamazaki et al. |

FOREIGN PATENT DOCUMENTS

| | | |
|---|---|---|
| CN | 101079325 A | 11/2007 |
| CN | 101174066 A | 5/2008 |
| CN | 101202114 A | 6/2008 |
| CN | 101242178 A | 8/2008 |
| CN | 101308705 A | 11/2008 |
| EP | 0651395 A | 5/1995 |
| EP | 1231594 A | 8/2002 |
| EP | 1737044 A | 12/2006 |
| EP | 1783777 A | 5/2007 |
| EP | 1895545 A | 3/2008 |
| EP | 2226847 A | 9/2010 |
| EP | 3249694 A | 11/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-158824 A | 7/1991 |
| JP | 05-251705 A | 9/1993 |
| JP | 06-202156 A | 7/1994 |
| JP | 07-182891 A | 7/1995 |
| JP | 08-264794 A | 10/1996 |
| JP | 09-182004 A | 7/1997 |
| JP | 11-505377 | 5/1999 |
| JP | 2000-044236 A | 2/2000 |
| JP | 2000-150900 A | 5/2000 |
| JP | 2001-035180 A | 2/2001 |
| JP | 2002-076356 A | 3/2002 |
| JP | 2002-203397 A | 7/2002 |
| JP | 2002-289859 A | 10/2002 |
| JP | 2002-335153 A | 11/2002 |
| JP | 2003-086000 A | 3/2003 |
| JP | 2003-086808 A | 3/2003 |
| JP | 2004-078172 A | 3/2004 |
| JP | 2004-103957 A | 4/2004 |
| JP | 2004-226429 A | 8/2004 |
| JP | 2004-273614 A | 9/2004 |
| JP | 2004-273732 A | 9/2004 |
| JP | 2006-165532 A | 6/2006 |
| JP | 2007-073562 A | 3/2007 |
| JP | 2007-096055 A | 4/2007 |
| JP | 2007-123861 A | 5/2007 |
| JP | 2007-529119 | 10/2007 |
| JP | 2008-009393 A | 1/2008 |
| JP | 2008-053356 A | 3/2008 |
| JP | 2008-083692 A | 4/2008 |
| JP | 2008-089874 A | 4/2008 |
| JP | 2008-107807 A | 5/2008 |
| JP | 2008-140490 A | 6/2008 |
| JP | 2008-141119 A | 6/2008 |
| JP | 2008-166716 A | 7/2008 |
| JP | 2008-193545 A | 8/2008 |
| JP | 2008-281988 A | 11/2008 |
| JP | 2009-004757 A | 1/2009 |
| JP | 2009-004787 A | 1/2009 |
| JP | 2009-099847 A | 5/2009 |
| JP | 2009-141002 A | 6/2009 |
| JP | 2010-056540 A | 3/2010 |
| JP | 2010-056541 A | 3/2010 |
| JP | 2010-103340 A | 5/2010 |
| JP | 2010-103360 A | 5/2010 |
| JP | 2011-029626 A | 2/2011 |
| JP | 2011-029627 A | 2/2011 |
| JP | 2011-029628 A | 2/2011 |
| JP | 2011-029629 A | 2/2011 |
| JP | 2011-029630 A | 2/2011 |
| JP | 2011-035388 A | 2/2011 |
| JP | 2011-035389 A | 2/2011 |
| JP | 2011-040726 A | 2/2011 |
| JP | 2011-040730 A | 2/2011 |
| JP | 2011-054949 A | 3/2011 |
| JP | 2011-077513 A | 4/2011 |
| JP | 5839747 | 1/2016 |
| JP | 5980402 | 8/2016 |
| JP | 6574824 | 9/2019 |
| JP | 6850839 | 3/2021 |
| KR | 2008-0056098 A | 6/2008 |
| KR | 2009-0131249 A | 12/2009 |
| TW | 200910468 | 3/2009 |
| WO | WO-2002/065062 | 8/2002 |
| WO | WO-2004/114391 | 12/2004 |
| WO | WO-2005/093850 | 10/2005 |
| WO | WO-2008/023553 | 2/2008 |
| WO | WO-2008/069056 | 6/2008 |
| WO | WO-2008/069255 | 6/2008 |
| WO | WO-2008/069286 | 6/2008 |
| WO | WO-2008/126879 | 10/2008 |
| WO | WO-2009/072532 | 6/2009 |
| WO | WO-2011/001879 | 1/2011 |
| WO | WO-2011/001880 | 1/2011 |
| WO | WO-2011/001881 | 1/2011 |
| WO | WO-2011/002046 | 1/2011 |
| WO | WO-2011/004724 | 1/2011 |
| WO | WO-2011/004755 | 1/2011 |
| WO | WO-2011/007675 | 1/2011 |
| WO | WO-2011/007677 | 1/2011 |
| WO | WO-2011/043215 | 4/2011 |
| WO | WO-2011/043451 | 4/2011 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2010/066743) dated Dec. 28, 2010.

Written Opinion (Application No. PCT/JP2010/066743) dated Dec. 28, 2010.

Office Action (U.S. Appl. No. 12/730,288) dated Jan. 14, 2014.

Pending Claims (U.S. Appl. No. 12/730,288)Dated Nov. 22, 2013.

Pending Claims (U.S. Appl. No. 13/302,222)Dated Feb. 12, 2014.

Chinese Office Action (Application No. 201080042876.2) dated Aug. 5, 2014.

Taiwanese Office Action (Application No. 099133861) dated Sep. 18, 2015.

Chinese Office Action (Application No. 201710387196.8) dated Dec. 17, 2018.

Chinese Office Action (Application No. 201710387197.2) dated Feb. 3, 2020.

Uemura.T et al., "A Three-Valued D-Flip-Flop and Shift Register Using Multiple-Junction Surface Tunnel Transistors", IEEE Transactions on Electron Devices, Aug. 7, 2002, vol. 49, No. 8, pp. 1336-1340.

* cited by examiner

FIG. 15A
FIG. 15B
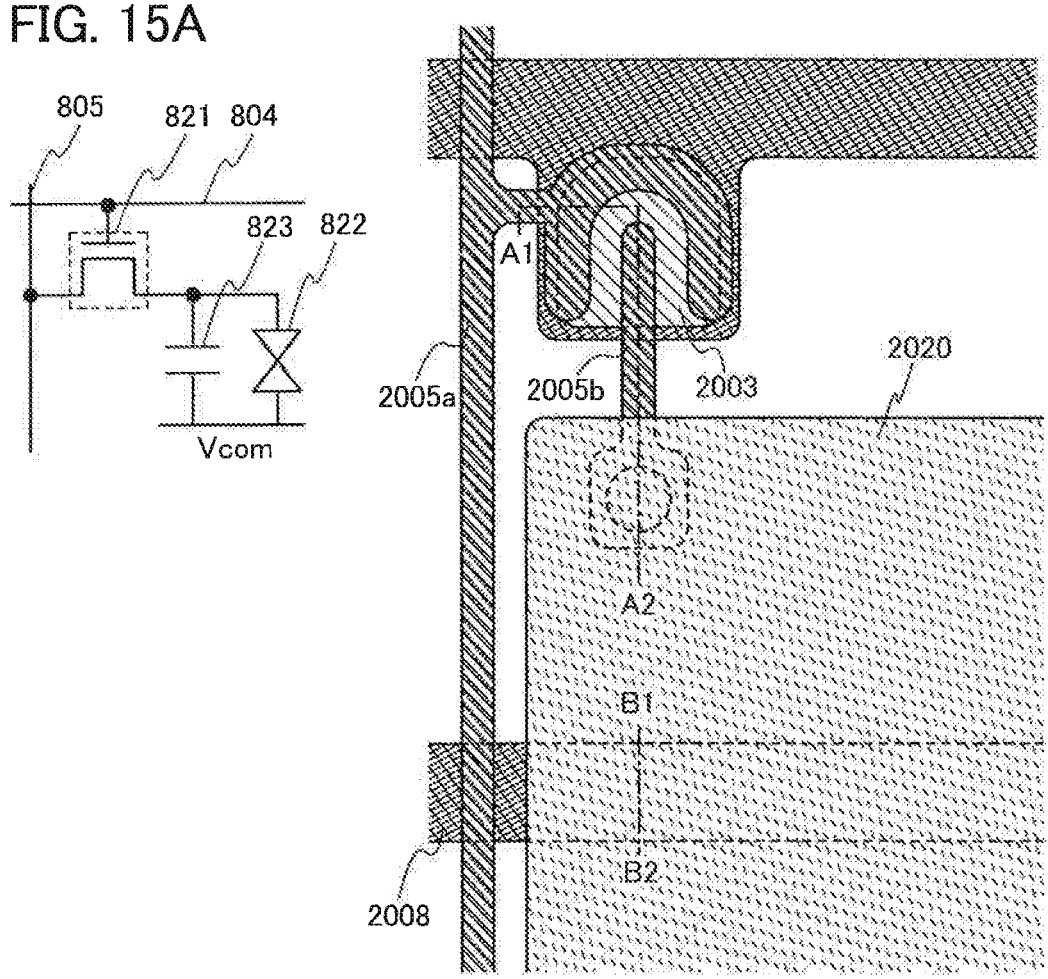
FIG. 15C
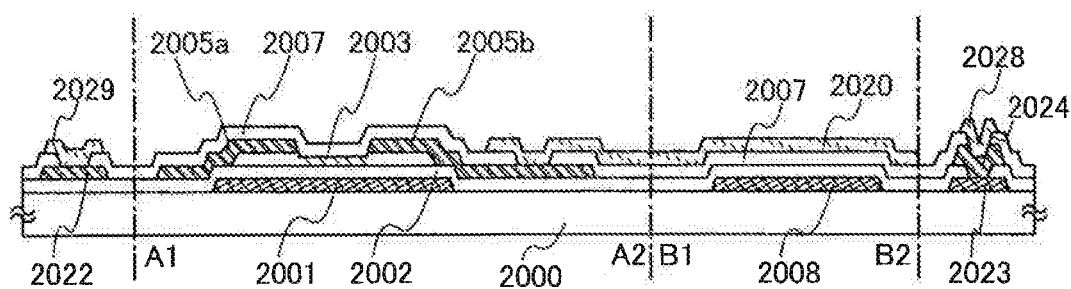

SHIFT REGISTER AND DISPLAY DEVICE AND DRIVING METHOD THEREOF

CROSS-REFERENCE TO RELATED APPLICATIONS

This application is a continuation of U.S. application Ser. No. 14/010,843, filed Aug. 27, 2013, now pending, which is a continuation of U.S. application Ser. No. 12/897,360, filed Oct. 4, 2010, now U.S. Pat. No. 8,526,567, which claims the benefit of a foreign priority application filed in Japan as Serial No. 2009-234845 on Oct. 9, 2009, all of which are incorporated by reference.

TECHNICAL FIELD

The present invention relates to a shift register and a display device including the shift register.

BACKGROUND ART

A thin film transistor (TFT) formed over a flat plate such as a glass substrate, which is typically used in a liquid crystal display device, is generally formed using a semiconductor material such as amorphous silicon or polycrystalline silicon. Although a TFT which is formed using amorphous silicon has low field-effect mobility, such a TFT can be formed over a larger glass substrate. On the other hand, a TFT formed using polycrystalline silicon has high field-effect mobility, but such a TFT needs a crystallization step such as laser annealing and is not always suitable for being formed over a larger glass substrate.

In view of the foregoing, a TFT formed using an oxide semiconductor as a semiconductor material has attracted attention. For example, Patent Documents 1 and 2 each disclose a technique in which a TFT is formed using zinc oxide or an In—Ga—Zn—O-based oxide semiconductor as a semiconductor material and used for a switching element in an image display device.

A TFT in which a channel formation region is formed in an oxide semiconductor can have higher electric-field mobility than a TFT formed using amorphous silicon. Further, an oxide semiconductor film can be formed at a temperature of 300° C. or lower by a sputtering method or the like, and a manufacturing process of the TFT formed using an oxide semiconductor is simpler than that of the TFT formed using polycrystalline silicon.

TFTs which are formed using such an oxide semiconductor are expected to be applied to switching elements included in a pixel portion and a driver circuit of a display device such as a liquid crystal display, an electroluminescent display, and electronic paper. For example, Non-Patent Document 1 discloses a technique by which a pixel portion and a driver circuit of a display device include TFTs formed using the above oxide semiconductor.

Note that the TFTs which are formed using an oxide semiconductor are all re-channel transistors. Therefore, in the case where a driver circuit is formed using a TFT formed using an oxide semiconductor, the driver circuit includes only n-channel TFTs (hereinafter also referred to as unipolar TFTs).

[Patent Document 1] Japanese Published Patent Application No. 2007-123861
[Patent Document 2] Japanese Published Patent Application No. 2007-096055
[Non-Patent Document 1] T. Osada, et al., SID 09 DIGEST, pp. 184-187 (2009)

DISCLOSURE OF INVENTION

A driver circuit includes a shift register, a buffer, and the like. For example, in the case where the shift register includes only unipolar TFTs, there is a problem in that a signal decreases or increases by the same amount as the threshold voltage of the TFT. Therefore, bootstrap operation is often performed in a portion where such a problem occurs. Specifically, the bootstrap operation is often performed in an analog switch by which a signal line or a scan line in a display device is driven.

Further, in the case where the load of a driver circuit utilizing bootstrap is heavy, a gate width of a TFT included in the driver circuit needs to be made larger. In accordance with that, parasitic capacitance caused in the TFT becomes larger. In particular, parasitic capacitance becomes larger in a TFT in which a conductive layer serving as a gate terminal and a conductive layer serving as a source or drain terminal need to be overlapped with each other with a gate insulating layer provided therebetween (e.g., a so-called inverted staggered TFT). As a result, there is a problem in that the power consumption of a clock signal inputted to the driver circuit is made large by the parasitic capacitance.

In view of the above problems, an object of one embodiment of the present invention is to reduce the power consumption of a shift register or a display device including the shift register.

The above problems can be solved by dividing a clock signal line included in a shift register into a plurality of pulse signal lines. In other words, a plurality of flip-flops included in the shift register is not electrically connected to one clock signal line; and a plurality of pulse signal lines is provided and part of the plurality of flip-flops is electrically connected to one of the plurality of pulse signal lines. The pulse signal line supplies a clock signal in part of an operation period of the shift register, not during the whole operation period of the shift register. Therefore, the capacity load caused with the supply of clock signals to the shift register can be reduced, leading to reduction in power consumption of the shift register.

One embodiment of the present invention is a shift register including a first pulse signal line serving as a wiring for supplying a clock signal that periodically alternates between a high power supply potential and a low power supply potential during a first period; a second pulse signal line serving as a wiring for supplying a clock signal during a second period; a third pulse signal line serving as a wiring for supplying an inverted clock signal that is an inversion of the clock signal during a third period; a fourth pulse signal line serving as a wiring for supplying an inverted clock signal during a fourth period; a first flip-flop which is electrically connected to the first pulse signal line and outputs the high power supply potential in the first period; a second flip-flop which is electrically connected to the second pulse signal line and outputs the high power supply potential in the second period; a third flip-flop which is electrically connected to the first flip-flop and the third pulse signal line and outputs the high power supply potential in the third period; and a fourth flip-flop which is electrically connected to the second flip-flop and the fourth pulse signal line and outputs the high power supply potential in the fourth period. The third period overlaps with the first period, and the fourth period overlaps with the second period.

Another embodiment of the present invention is a shift register with the above-mentioned structure, in which the first pulse signal line serves as a wiring for supplying the low power supply potential in a period except the first period; the second pulse signal line serves as a wiring for supplying the low power supply potential in a period except the second period; the third pulse signal line serves as a wiring for supplying the low power supply potential in a period except the third period; and the fourth pulse signal line serves as a wiring for supplying the low power supply potential in a period except the fourth period.

Another embodiment of the present invention is a shift register with any one of the above-mentioned structures, in which a flip-flop includes a transistor whose channel formation region is formed using an oxide semiconductor.

Another embodiment of the present invention is a shift register with any one of the above-mentioned structures, in which a pulse signal line is electrically connected to a reference clock signal line or an inverted reference signal line via a transistor which is kept on in a period when the pulse signal line supplies a clock signal or an inverted clock signal.

Another embodiment of the present invention is a shift register with any one of the above-mentioned structures, in which a pulse signal line is electrically connected to a wiring for supplying a low power supply potential via a transistor which is kept on in the period when the pulse signal line does not supply a clock signal or an inverted clock signal.

Another embodiment of the present invention is a display device which includes a shift register with any one of the above-mentioned structures.

In a shift register which is one embodiment of the present invention, a clock signal is supplied by a plurality of wirings, not by one wiring. Any one of the plurality of wirings supplies a clock signal in only part of the operation period of the shift register, not during the whole operation period of the shift register. Therefore, the capacity load caused with the supply of clock signals can be reduced, leading to reduction in power consumption of the shift register.

BRIEF DESCRIPTION OF DRAWINGS

In the accompanying drawings:

FIGS. 15A to 15C are a circuit diagram, a top diagram, and a cross-sectional diagram, respectively, of a pixel of a liquid crystal display device described in Embodiment 6;

BEST MODE FOR CARRYING OUT THE INVENTION

Figure 1A:
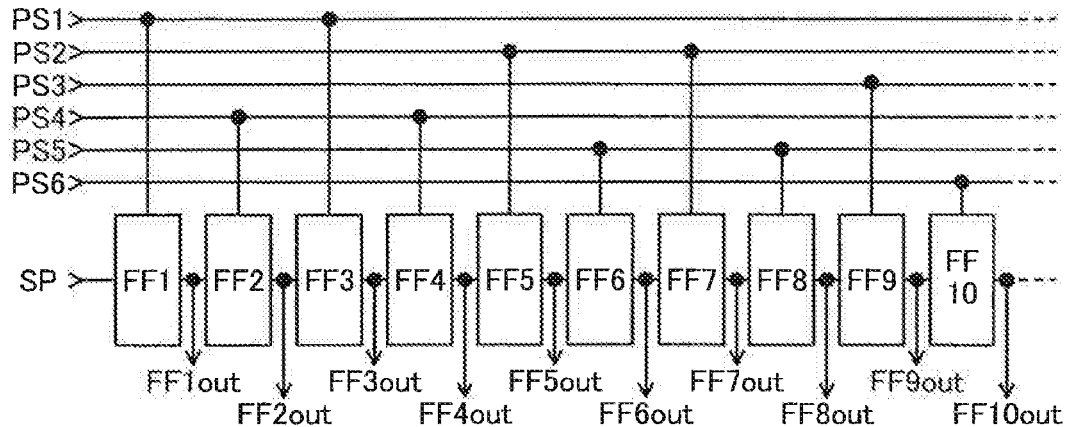
FIGS. 1A and 1B are a diagram illustrating a configuration example and a timing chart, respectively, of a shift register described in Embodiment 1.

Hereinafter, embodiments of the present invention will be described in detail with reference to the accompanying drawings. Note that the present invention is not limited to the description below, and it is easily understood by those skilled in the art that a variety of changes and modifications in modes and details thereof can be made without departing from the spirit and scope of the present invention. Therefore, the present invention should not be interpreted as being limited to the description of the embodiments below.

Note that it is difficult to determine which one of the terminals of a transistor is a source terminal or a drain terminal because it changes depending on the structure, operating conditions, and the like of the transistor. Therefore, in this document, one of a source terminal and a drain terminal is referred to as a first terminal and the other thereof is referred to as a second terminal for distinction.

Note that the size, the thickness of a layer, or a region of each structure illustrated in drawings or the like in embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

Embodiment 1

In this embodiment, examples of a structure and operation of a shift register are described with reference to FIGS. 1A and 1B, FIGS. 2A and 2B, FIGS. 3A and 3B, FIGS. 4A and 4B, FIGS. 5A to 5C, FIGS. 6A to 6C, and FIGS. 7A and 7B. Specifically, a shift register which includes a pulse signal line and a flip-flop is described. The pulse signal line serves as a wiring for supplying a clock signal in part of the operation period of the shift register and serves as a wiring for supplying a low power supply potential in the other periods. The flip-flop is electrically connected to the pulse signal line.

(Example of Structure of Shift Register)

A shift register in this embodiment includes first to sixth pulse signal lines and first to tenth flip-flops.

The first pulse signal line (PS1) is electrically connected to the first flip-flop (FF1) and the third flip-flop (FF3). The second pulse signal line (PS2) is electrically connected to the fifth flip-flop (FF5) and the seventh flip-flop (FF7). The third pulse signal line (PS3) is electrically connected to the ninth flip-flop (FF9). The fourth pulse signal line (PS4) is electrically connected to the second flip-flop (FF2) and the fourth flip-flop (FF4). The fifth pulse signal line (PS5) is electrically connected to the sixth flip-flop (FF6) and the eighth flip-flop (FF8). The sixth pulse signal line (PS6) is electrically connected to the tenth flip-flop (FF10) (see FIG. 1A).

An output terminal of each flip-flop is electrically connected to an input terminal of the subsequent flip-flop. Note that an input terminal of the first flip-flop (FF1) is electrically connected to a wiring for supplying a start pulse (SP).

In a first period (t1), the first pulse signal line (PS1) serves as a wiring for supplying a clock signal that periodically alternates between a high power supply potential and a low power supply potential. In a second period (t2), the second pulse signal line (PS2) serves as a wiring for supplying a clock signal. In a third period (t3), the third pulse signal line (PS3) serves as a wiring for supplying a clock signal. In a fourth period (t4), the fourth pulse signal line (PS4) serves as a wiring for supplying an inverted clock signal that is the inversion of a clock signal. In a fifth period (t5), the fifth pulse signal line (PS5) serves as a wiring for supplying an inverted clock signal. In a sixth period (t6), the sixth pulse signal line (PS6) serves as a wiring for supplying an inverted clock signal (see FIG. 1B).

(Example of Operation of Shift Register)

The operation of the shift register in this embodiment is described below.

A high power supply potential signal is inputted as a start pulse (SP) to the input terminal of the first flip-flop (FF1). The first flip-flop (FF1) operates on the basis of the inputted signal, and outputs a high power supply potential signal as an output signal (FF1out) of the first flip-flop with a half clock cycle delay.

The output signal (FF1out) is inputted to an input terminal of the second flip-flop (FF2). Like the first flip-flop (FF1), the second flip-flop (FF2) operates on the basis of the inputted signal, and outputs a high power supply potential signal as an output signal (FF2out) of the second flip-flop with a half clock cycle delay.

Similarly, as for the other flip-flops, a high power supply potential signal is inputted to an input terminal of the subsequent flip-flop, and the flip-flop outputs a high power supply potential signal with a half clock cycle delay.

<Specific Example of Flip-Flop>

Figure 2A:
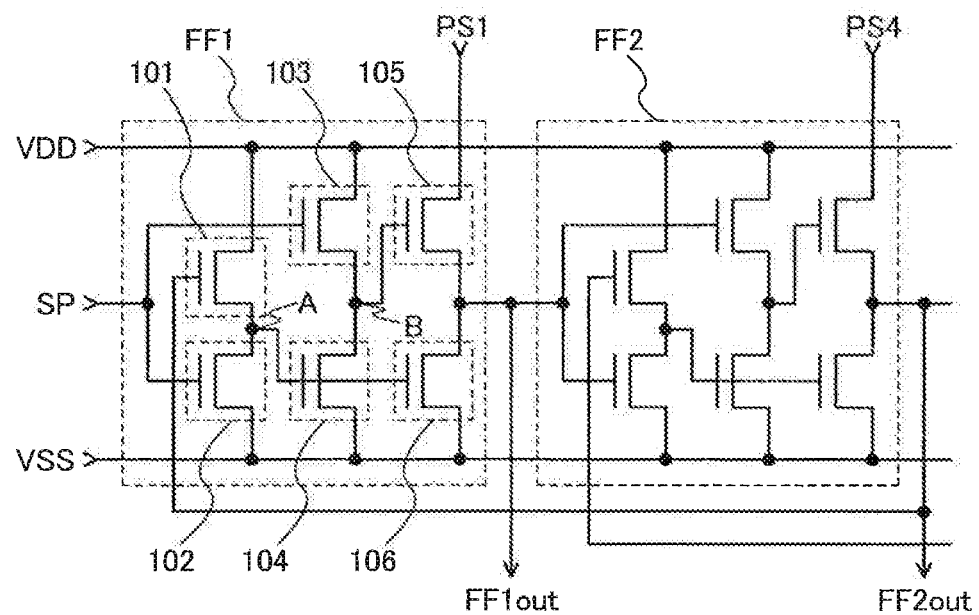
FIGS. 2A and 2B are a diagram illustrating a configuration example and a timing chart, respectively, of a flip-flop described in Embodiment 1.

A specific example of a circuit configuration of the flip-flop in this embodiment is illustrated in FIG. 2A. Note that only configurations of the first flip-flop (FF1) and the second flip-flop (FF2) are illustrated in FIG. 2A for convenience.

The first flip-flop (FF1) includes transistors 101 to 106. Note that in this case, the transistors 101 to 106 are n-channel transistors.

A gate terminal of the transistor 101 is electrically connected to the output terminal of the second flip-flop (FF2). A first terminal of the transistor 101 is electrically connected to a wiring for supplying a high power supply potential (VDD) (hereinafter also referred to as a high power supply potential line).

A gate terminal of the transistor 102 is electrically connected to a wiring for supplying a start pulse (SP) (hereinafter also referred to as a start pulse line). A first terminal of the transistor 102 is electrically connected to a second terminal of the transistor 101. A second terminal of the transistor 102 is electrically connected to a wiring for supplying a low power supply potential (VSS) (hereinafter also referred to as a low power supply potential line).

A gate terminal of the transistor 103 is electrically connected to the start pulse line. A first terminal of the transistor 103 is electrically connected to the high power supply potential line.

A gate terminal of the transistor 104 is electrically connected to the second terminal of the transistor 101 and the first terminal of the transistor 102. A first terminal of the transistor 104 is electrically connected to a second terminal of the transistor 103. A second terminal of the transistor 104 is electrically connected to the low power supply potential line.

A gate terminal of the transistor 105 is electrically connected to the second terminal of the transistor 103 and the first terminal of the transistor 104. A first terminal of the transistor 105 is electrically connected to the first pulse signal line (PS1).

A gate terminal of the transistor 106 is electrically connected to the second terminal of the transistor 101, the first terminal of the transistor 102, and the gate terminal of the transistor 104. A first terminal of the transistor 106 is electrically connected to a second terminal of the transistor 105. A second terminal of the transistor 106 is electrically connected to the low power supply potential line.

Note that hereinafter, for convenience, a node in which the second terminal of the transistor 101, the first terminal of the transistor 102, the gate terminal of the transistor 104, and the gate terminal of the transistor 106 are electrically connected is referred to as a node A; and a node in which the second terminal of the transistor 103, the first terminal of the transistor 104, and the gate terminal of the transistor 105 are electrically connected to each other is referred to as a node B.

In addition to the above configuration, a capacitor may be provided between the gate terminal and the source terminal of the transistor 105. The capacitor is provided, so that a bootstrap operation, which is described below, can be surely performed.

<Example of Operation of Flip-Flop>

Figure 2B:
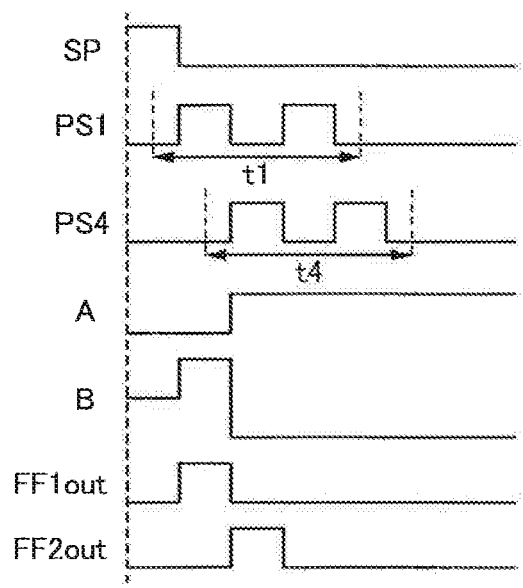

As an example of operation of the above-mentioned flip-flops, operation of the first flip-flop (FF1) is described below with reference to FIG. 2B.

First, the potential of the start pulse line electrically connected to the first flip-flop (FF1) is increased to a high level (hereinafter referred to as an H level). Accordingly, H-level signals are inputted to the gate terminals of the transistors 102 and 103. Thus, the transistors 102 and 103 are turned on. Then, the potential of the node A is decreased to a low level (hereinafter referred to as an L level) and the potential of the node B is increased to an H level. In accordance with this, the transistor 105 is also turned on. As a result, an L-level potential, which is the potential of the first pulse signal line (PS1) in this period, is outputted as the output signal (FF1out) of the first flip-flop.

In the subsequent period, the potential of the start pulse line is decreased to an L level. Thus, the transistors 102 and 103 are turned off. As a result, the potential of the node A and the potential of the node B go into a floating state. At this time, there is a potential difference from the L level to the H level between the source terminal and the gate terminal of the transistor 105, and the potential difference is maintained because the node B goes into a floating state. That is, the transistor 105 is kept on regardless of the state of the source terminal. Moreover, the potential of the first pulse signal line (PS1) is increased to an H level. Thus, the potential of the node B which is in a floating state and electrically connected to the gate terminal of the transistor 105 is further increased by an H-level potential of the first pulse signal line (PS1) in this period. The operation in which the potential of the node B is increased by capacitive coupling of the source terminal and the gate terminal that is electrically connected to the node B in the floating state, of the transistor 105 as described above, is called bootstrap. Accordingly, an H-level potential, which is the potential of the first pulse signal line (PS1), is outputted as the output signal (FF1out) of the first flip-flop.

Note that in this case, the transistor 105 is an n-channel transistor. Thus, in this period when the potential of the first pulse signal line (PS1) is set to an H level, a terminal of the transistor 105 which is electrically connected to the output terminal of the first flip-flop (FF1) functions as a source terminal, and a terminal of the transistor 105 which is electrically connected to the first pulse signal line (PS1) functions as a drain terminal. A transistor is turned on or turned off depending on the potential difference between a source terminal and a gate terminal. Therefore, in the case where an H-level potential of the first pulse signal line (PS1) is outputted as the output signal (FF1out) of the first flip-flop via an n-channel transistor in which bootstrap does not occur, the outputted potential is reduced from the H-level potential by the threshold voltage (Vth) of the n-channel transistor. However, since the bootstrap occurs in the transistor 105, the output signal (FF1out) of the first flip-flop can be outputted without a reduction in the potential of the first pulse signal line (PS1).

An H-level signal which is the output signal of the first flip-flop (FF1) is inputted to the second flip-flop (FF2). In this case, the second flip-flop (FF2) has the same structure as that of the first flip-flop (FF1) except that the fourth pulse signal line (PS4), instead of the first pulse signal line (PS1), is electrically connected to the second flip-flop (FF2). Thus, the above-mentioned description of the first flip-flop (FF1) applies to detailed description of the circuit operation of the second flip-flop (FF2). In this period, the second flip-flop (FF2) outputs an L-level potential which is the potential of the fourth pulse signal line (PS4) in this period.

In the subsequent period, the potential of the first pulse signal (PS1) is decreased to an L level and the potential of the fourth pulse signal line (PS4) is increased to an H level. As a result, the output signal (FF1out) of the first flip-flop is decreased to an L level. An H-level potential which is the potential of the fourth pulse signal line (PS4) is outputted as the output signal (FF2out) of the second flip-flop.

The output signal (FF2out) of the second flip-flop is inputted to the third flip-flop (not illustrated) and to the gate terminal of the transistor 101 included in the first flip-flop (FF1). Thus, the transistor 101 included in the first flip-flop (FF1) is turned on, and then the potential of the node A is set to an H level. Accordingly, the transistors 104 and 106 are also turned on. Since the transistor 104 is turned on, the potential of the node B is decreased to an L level. That is, the potential of the gate terminal of the transistor 105 is decreased to an L level. Therefore, the transistor 105 is turned off. In addition, since the transistor 106 is turned on, the output signal (FF1out) of the first flip-flop is changed from the L level of the first pulse signal line (PS1) via the transistor 105 in this period to an L level of the low power supply potential (VSS) via the transistor 106. In other words, the output signal (FF1out) of the first flip-flop is outputted via a different transistor without being substantially changed.

In the subsequent period, the potential of the fourth pulse signal line (PS4) is decreased to an L level. That is, the output signal (FF2out) of the second flip-flop is decreased to an L level. Thus, the transistor 101 included in the first flip-flop (FF1) is turned off. As a result, a node electrically connected to the gate terminal of the transistor 104 and a node electrically connected to the gate terminal of the transistor 106 go into a floating state while such nodes keep the H-level signals. Thus, the transistors 104 and 106 are kept on and the output signal (FF1out) of the first flip-flop is maintained at an L level. Such a state is continued until an H-level potential is inputted to the input terminal of the first flip-flop (FF1) again.

In the above-mentioned manner, the first flip-flop (FF1) illustrated in FIG. 2A can output a signal which is inputted with a half clock cycle delay.

<Example of Pulse Signal Line>

The first pulse signal line (PS1) to the sixth pulse signal line (PS6) each serve as a wiring for supplying a clock signal in part of the operation period, and the first to sixth pulse signal lines each serve as a wiring for supplying a low power supply potential in the other periods. An example of a wiring having such functions is described with reference to FIGS. 3A and 3B and FIGS. 4A and 4B.

Figure 3A:
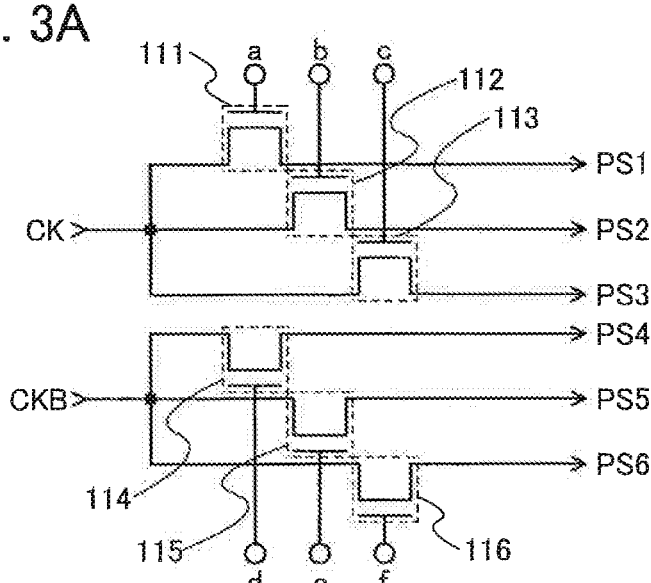
FIGS. 3A and 3B are a diagram illustrating a configuration example and a timing chart, respectively, of a pulse signal line described in Embodiment 1.

Each of the first pulse signal line (PS1) to the sixth pulse signal line (PS6) illustrated in FIG. 3A is electrically connected to a reference clock signal line (CK) or an inverted reference clock signal line (CKB) via a source terminal and a drain terminal of any one of clock signal selection transistors 111, 112, and 113 and inverted clock signal selection transistors 114, 115, and 116. Note that in this case, the clock signal selection transistors 111, 112, and 113 and the inverted clock signal selection transistors 114, 115, and 116 are n-channel transistors.

Specifically, a gate terminal of the clock signal selection transistor 111 is electrically connected to a control terminal a. A first terminal of the clock signal selection transistor 111 is electrically connected to the first pulse signal line (PS1). A second terminal of the clock signal selection transistor 111 is electrically connected to the reference clock signal line (CK). A gate terminal of the clock signal selection transistor 112 is electrically connected to a control terminal b. A first terminal of the clock signal selection transistor 112 is electrically connected to the second pulse signal line (PS2). A second terminal of the clock signal selection transistor 112 is electrically connected to the reference clock signal line (CK). A gate terminal of the clock signal selection transistor 113 is electrically connected to a control terminal c. A first terminal of the clock signal selection transistor 113 is electrically connected to the third pulse signal line (PS3). A second terminal of the clock signal selection transistor 113 is electrically connected to the reference clock signal line (CK).

A gate terminal of the inverted clock signal selection transistor 114 is electrically connected to a control terminal d. A first terminal of the inverted clock signal selection transistor 114 is electrically connected to the fourth pulse signal line (PS4). A second terminal of the inverted clock signal selection transistor 114 is electrically connected to the inverted reference clock signal line (CKB). A gate terminal of the inverted clock signal selection transistor 115 is electrically connected to a control terminal e. A first terminal of the inverted clock signal selection transistor 115 is electrically connected to the fifth pulse signal line (PS5). A second terminal of the inverted clock signal selection transistor 115 is electrically connected to the inverted reference clock signal line (CKB). A gate terminal of the inverted clock signal selection transistor 116 is electrically connected to a control terminal f. A first terminal of the inverted clock signal selection transistor 116 is electrically connected to the sixth pulse signal line (PS6). A second terminal of the inverted clock signal selection transistor 116 is electrically connected to the inverted reference clock signal line (CKB).

Figure 3B:
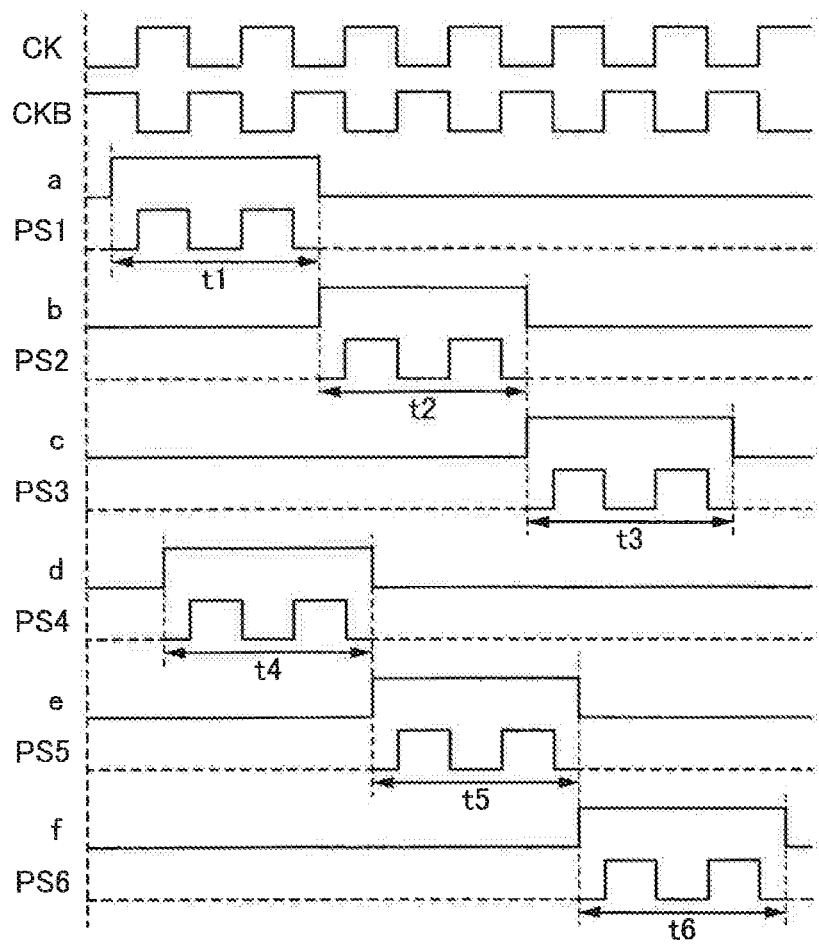

As illustrated in FIG. 3B, the reference clock signal line is a wiring for supplying a clock signal that periodically alternates between a high power supply potential and a low power supply potential regardless of a period, and the inverted reference clock signal line is a wiring for supplying an inverted clock signal that is the inversion of a clock signal, regardless of a period.

The potential of the control terminal a is set to an H level in the first period (t1), and is set to an L level in the other periods. Thus, in the first period (t1), the first pulse signal line (PS1) can serve as a wiring for supplying a clock signal. In other words, the first period (t1) is a period in which the potential of the control terminal a is set to an H level.

Similarly, the potentials of the control terminals b to f are set to an H level in the second period (t2) to the sixth period (t6), respectively, and are set to an L level in the other periods. Thus, the second pulse signal line in the second period and the third pulse signal line in the third period can serve as a wiring for supplying a clock signal; the fourth pulse signal line in the fourth period, the fifth pulse signal line in the fifth period, and the sixth pulse signal line in the sixth period can serve as a wiring for supplying an inverted clock signal. In other words, the second period (t2) to the sixth period (t6) are periods in which the potentials of the respective control terminals b to f are set to an H level.

Figure 4A:
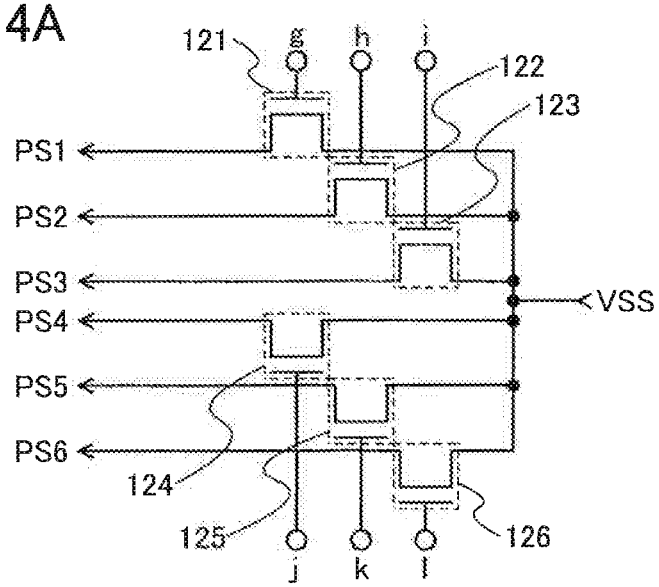
FIGS. 4A and 4B are a diagram illustrating a configuration example and a timing chart, respectively, of a pulse signal line described in Embodiment 1.
Figure 4B:
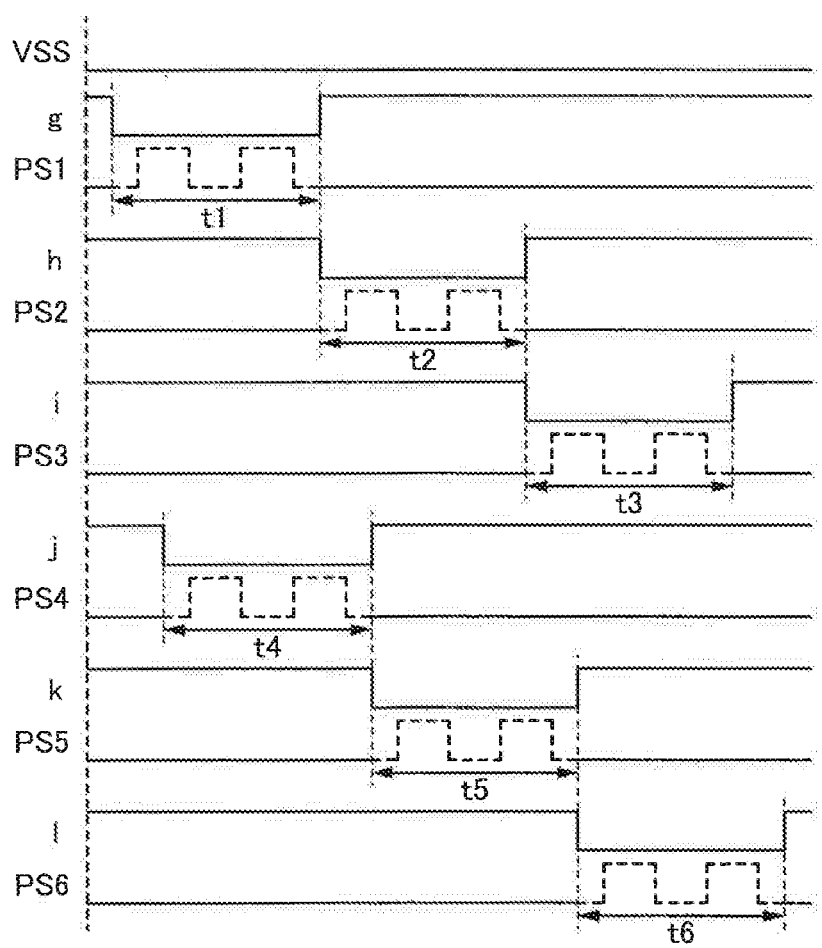

Each of the first pulse signal line (PS1) to the sixth pulse signal line (PS6) illustrated in FIG. 4A is electrically connected to a wiring for supplying a low power supply potential (VSS) via a source terminal and a drain terminal of one of low power supply potential selection transistors 121 to 126. Note that in this case, the low power supply potential selection transistors 121 to 126 are n-channel transistors.

A gate terminal of the low power supply potential selection transistor 121 is electrically connected to a control terminal g. A first terminal of the low power supply potential selection transistor 121 is electrically connected to the first pulse signal line (PS1). A second terminal of the low power supply potential selection transistor 121 is electrically connected to the wiring for supplying a low power supply potential (VSS). A gate terminal of the low power supply potential selection transistor 122 is electrically connected to a control terminal h. A first terminal of the low power supply potential selection transistor 122 is electrically connected to the second pulse signal line (PS2). A second terminal of the low power supply potential selection transistor 122 is electrically connected to the wiring for supplying a low power supply potential (VSS). A gate terminal of the low power supply potential selection transistor 123 is electrically connected to a control terminal i. A first terminal of the low power supply potential selection transistor 123 is electrically connected to the third pulse signal line (PS3). A second terminal of the low power supply potential selection transistor 123 is electrically connected to the wiring for supplying a low power supply potential (VSS). A gate terminal of the low power supply potential selection transistor 124 is electrically connected to a control terminal j. A first terminal of the low power supply potential selection transistor 124 is electrically connected to the fourth pulse signal line (PS4). A second terminal of the low power supply potential selection transistor 124 is electrically connected to the wiring for supplying a low power supply potential (VSS). A gate terminal of the low power supply potential selection transistor 125 is electrically connected to a control terminal k. A first terminal of the low power supply potential selection transistor 125 is electrically connected to the fifth pulse signal line (PS5). A second terminal of the low power supply potential selection transistor 125 is electrically connected to the wiring for supplying a low power supply potential (VSS). A gate terminal of the low power supply potential selection transistor 126 is electrically connected to a control terminal 1. A first terminal of the low power supply potential selection transistor 126 is electrically connected to the sixth pulse signal line (PS6). A second terminal of the low power supply potential selection transistor 126 is electrically connected to the wiring for supplying a low power supply potential (VSS).

The potential of the control terminal g is set to an L level in the first period (t1) and is set to an H level in the other periods. Thus, in the periods except the first period (t1), the first pulse signal line (PS1) can serve as a wiring for supplying a low power supply potential (VSS).

Similarly, the potentials of the control terminals h to l are set to an L level in the second period (t2) to the sixth period (t6), respectively, and are set to an H level in the other periods. Thus, the second pulse signal line in the periods except the second period, the third pulse signal line in the periods except the third period, the fourth pulse signal line in the periods except the fourth period, the fifth pulse signal line in the periods except the fifth period, and the sixth pulse signal line in the periods except the sixth period can serve as a wiring for supplying a low power supply potential (VSS).

In the shift register in this embodiment, clock signals are supplied by a plurality of wirings, not by one wiring. Further, any one of the plurality of wirings supplies clock signals in a part of period, not in the entire operation period of the shift register. Therefore, the capacity load caused with the supply of clock signals can be reduced, leading to a reduction in power consumption of the shift register.

Modification Example

The above-described shift register is an example of this embodiment, and a shift register which has a different point from the above description is included in this embodiment.

Figure 5A:
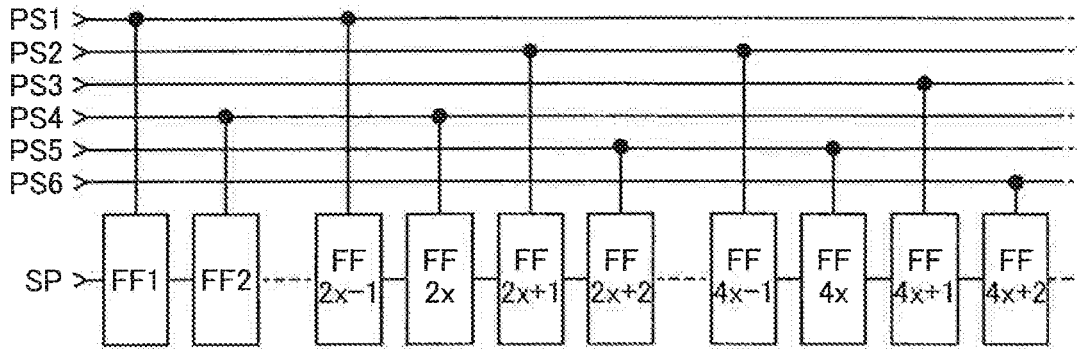
FIGS. 5A to 5C are diagrams illustrating modification examples of the shift register described in Embodiment 1.
Figure 5B:
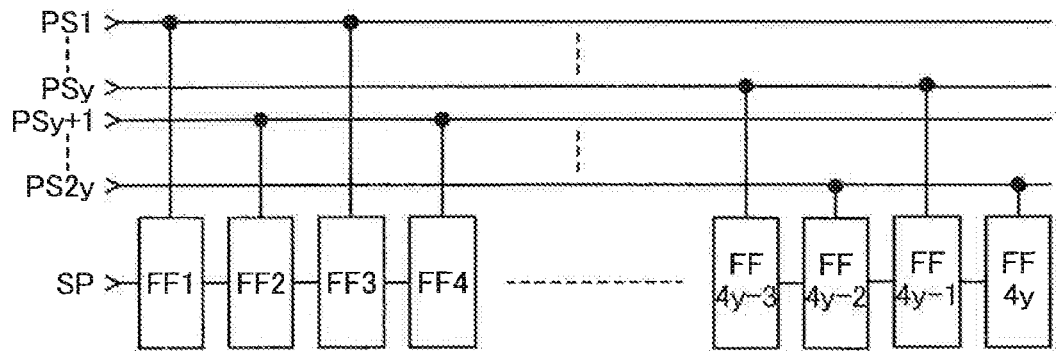
Figure 5C:
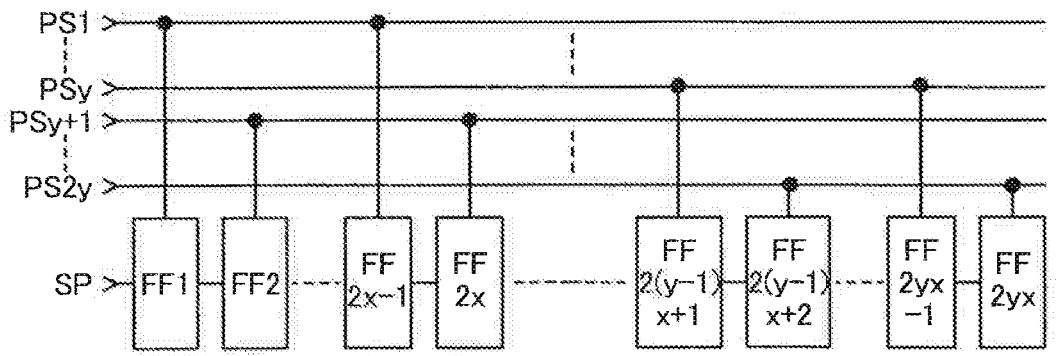

For example, in the above shift register, two flip-flops are electrically connected to each of the pulse signal lines (see FIG. 1A); however, a larger number of flip-flops may be electrically connected to each of the pulse signal lines. Specifically, as illustrated in FIG. 5A, x (x is a natural number of 3 or more) flip-flops can be electrically connected to each of the pulse signal lines, for example.

Further, six pulse signal lines are included in the above shift register (see FIG. 1A), but a larger number of pulse signal lines may be included. Specifically, a structure illustrated in FIG. 5B can be employed, which includes the first pulse signal line (PS1) to the y-th (y is a natural number of 4 or more) pulse signal line (PSy) which supply clock signals in part of the operation period; and the (y+1)th pulse signal line (PSy+1) to the 2y-th pulse signal line (PS2y) which supply inverted clock signals in part of the operation period. Two flip-flops are electrically connected to each of the pulse signal lines in the structure illustrated in FIG. 5B.

Furthermore, two flip-flops are electrically connected to each of the pulse signal lines and six pulse signal lines are included in the above shift register (see FIG. 1A); however, a larger number of flip-flops may be electrically connected to each of the pulse signal lines and a larger number of pulse signal lines may be included. Specifically, a structure illustrated in FIG. 5C can be employed: the first pulse signal line (PS1) to the y-th (y is a natural number of 4 or more) pulse signal line (PSy) which supply clock signals in part of the operation period are included; the (y+1)th pulse signal line (PSy+1) to the 2y-th pulse signal line (PS2y) which supply inverted clock signals in part of the operation period are included; and x flip-flops are electrically connected to each of the pulse signal lines, for example.

Figure 6A:
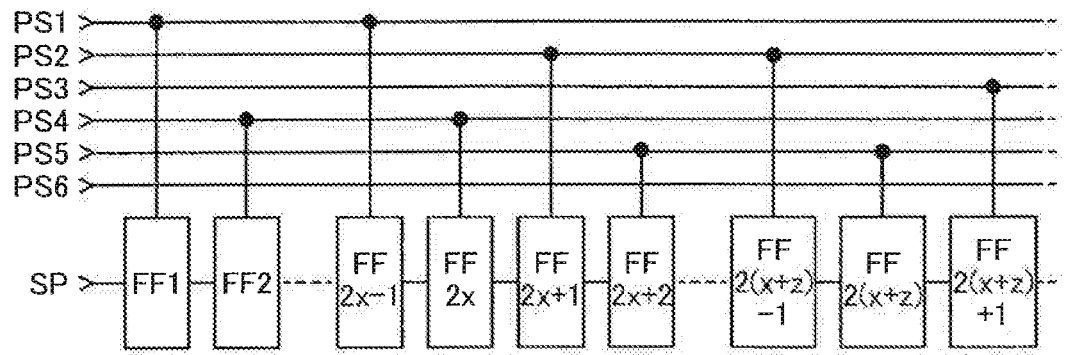
FIGS. 6A and 6B are diagrams and FIG. 6C is a timing chart illustrating modification examples of the shift register described in Embodiment 1.

In the above shift register, the numbers of flip-flops which are electrically connected to each of pulse signal lines are the same (see FIG. 1A and FIGS. 5A to 5C), but the number of flip-flops which are electrically connected to each of pulse signal lines may be different depending on a pulse signal line. Specifically, as illustrated in FIG. 6A, x flip-flops can be electrically connected to the first pulse signal line (PS1) and the fourth pulse signal line (PS4), and z flip-flops (z is a natural number of 2 or more and different from x) can be electrically connected to the second pulse signal line (PS2) and the fifth pulse signal line (PS5).

Figure 6B:
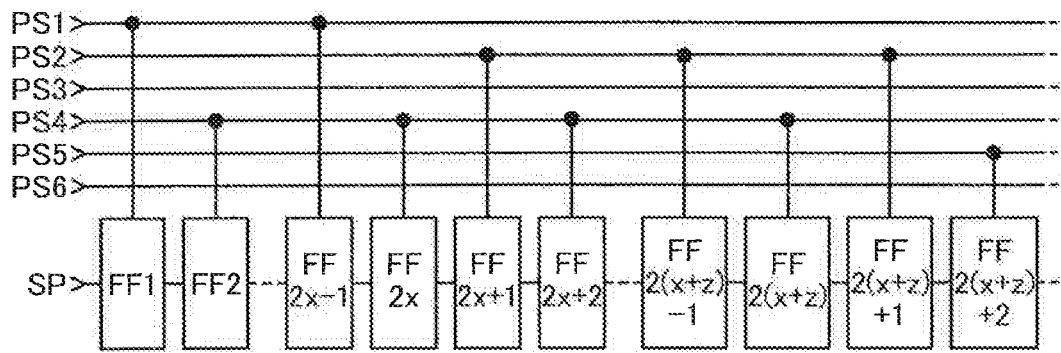

In the above shift register, the number of flip-flops which are electrically connected to the first pulse signal line (PS1) and the number of flip-flops which are electrically connected to the fourth pulse signal line (PS4) are the same (see FIG. 1A, FIG. 5A, and FIG. 6A), but the number of flip-flops which are electrically connected to the first pulse signal line (PS1) and the number of flip-flops which are electrically connected to the fourth pulse signal line (PS4) may be different from each other. Specifically, as illustrated in FIG. 6B, x flip-flops can be electrically connected to the first pulse signal line (PS1) and (x+z) flip-flops can be electrically connected to the fourth pulse signal line (PS4).

Figure 1B:
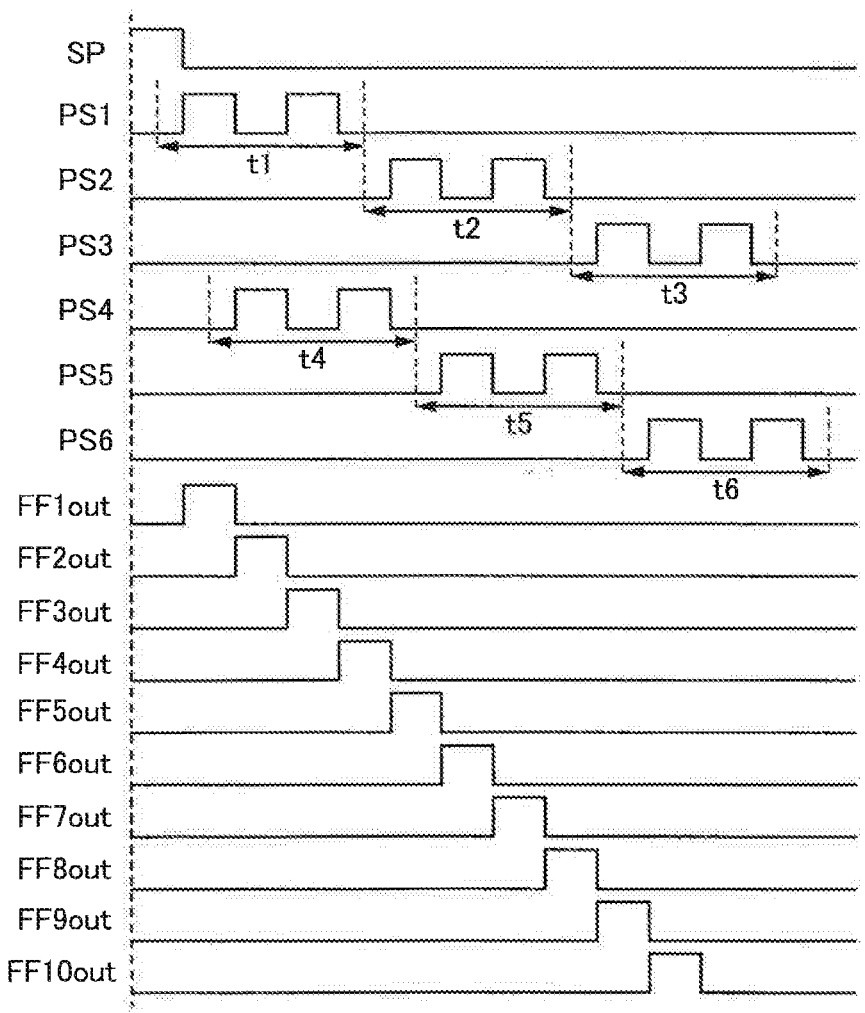
Figure 6C:
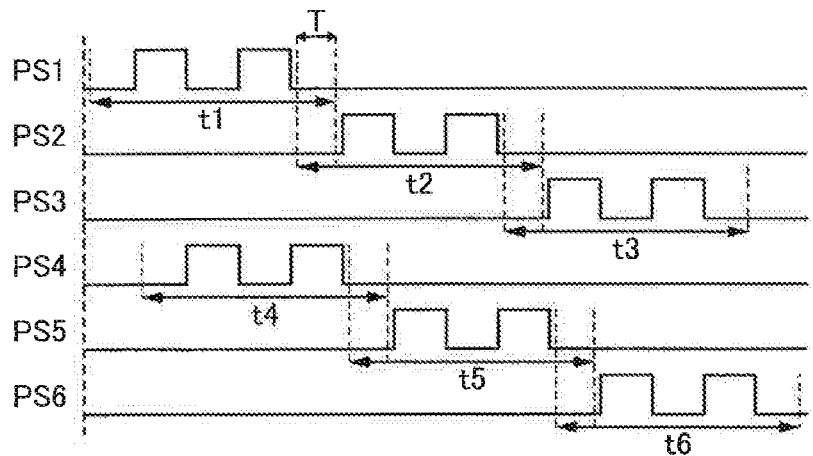

In the above shift register, the first period (t1) and the second period (t2) do not overlap with each other (see FIG. 1B), but the first period (t1) and the second period (t2) may be overlap with each other. Specifically, as illustrated in FIG. 6C, a period (T) in which the first period (t1) and the second period (t2) overlap with each other can be provided, for example. As illustrated in FIG. 1B and FIG. 6C, periods need to be provided so that at least one of plural pulse signal lines serves as a wiring for supplying a clock signal and at least one of a plurality of pulse signal lines serves as a wiring for supplying an inverted clock signal.

The circuit configuration of a flip-flop illustrated in FIG. 2A is an example, and any circuit configuration may be employed as long as an inputted signal is outputted with a delay. Specifically, the circuit illustrated in FIG. 7A can be applied to the flip-flop in this embodiment.

Figure 7A:
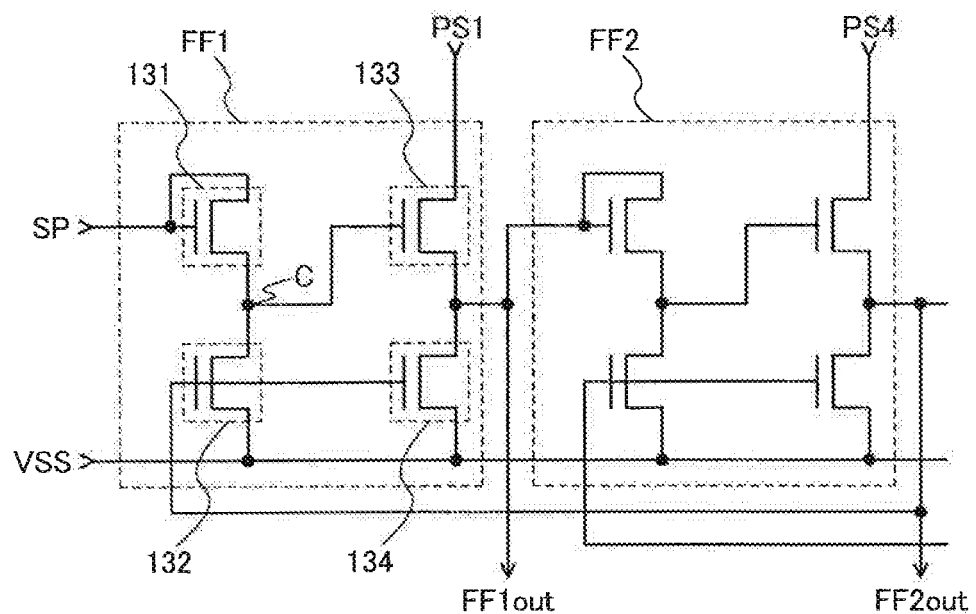
FIGS. 7A and 7B are a diagram and a timing chart, respectively, illustrating a modification example of the flip-flop described in Embodiment 1.

The first flip-flop (FF1) illustrated in FIG. 7A includes transistors 131 to 134. Note that in this case, the transistors 131 to 134 are n-channel transistors.

A gate terminal and a first terminal of the transistor 131 are electrically connected to the start pulse line.

A gate terminal of the transistor 132 is electrically connected to the output terminal of the second flip-flop (FF2), a first terminal of the transistor 132 is electrically connected to a second terminal of the transistor 131, and a second terminal of the transistor 132 is electrically connected to the low power supply potential line.

A gate terminal of the transistor 133 is electrically connected to the second terminal of the transistor 131 and the first terminal of the transistor 132, and a first terminal of the transistor 133 is electrically connected to the first pulse signal line (PS1).

A gate terminal of the transistor 134 is electrically connected to the output terminal of the second flip-flop (FF2), a first terminal of the transistor 134 is electrically connected to a second terminal of the transistor 133, and a second terminal of the transistor 134 is electrically connected to the low power supply potential line.

Note that hereinafter, for convenience, a node in which the second terminal of the transistor 131, the first terminal of the transistor 132, and the gate terminal of the transistor 133 are electrically connected to each other is referred to as a node C.

Figure 7B:
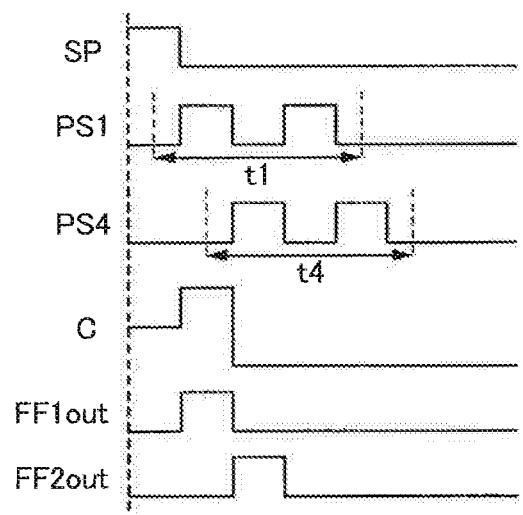

The operation of the first flip-flop (FF1) illustrated in FIG. 7A is described below with reference to FIG. 7B.

First, the potential of the start pulse line electrically connected to the first flip-flop (FF1) is increased to an H level. Accordingly, H-level signals are inputted to the gate terminal of the transistor 131 and the first terminal of the transistor 131, and the transistor 131 which is diode-connected is turned on. Thus, the potential of the node C is increased to an H level. Accordingly, the transistor 133 is also turned on. As a result, an L-level potential, which is the potential of the first pulse signal line (PS1) in this period, is outputted as the output signal (FF1out) of the first flip-flop.

In the subsequent period, the potential of the start pulse line is decreased to an L level. Thus, the transistor 131 is turned off. As a result, the potential of the node C goes into a floating state. At this time, there is a potential difference from the L level to the H level between the source terminal and the gate terminal of the transistor 131, and the potential difference is maintained because the node C goes into a floating state. That is, the transistor 131 is kept on regardless of the state of the source terminal. Moreover, the potential of the first pulse signal line (PS1) is increased to an H level. Thus, the potential of the node C which is in a floating state and electrically connected to the gate terminal of the transistor 133 is further increased by an H-level potential of the first pulse signal line (PS1) in this period. Accordingly, an H-level potential, which is the potential of the first pulse signal line (PS1), is outputted as the output signal (FF1out) of the first flip-flop.

An H-level signal which is the output signal of the first flip-flop (FF1) is inputted to the second flip-flop (FF2). In this case, the second flip-flop (FF2) has the same structure as that of the first flip-flop (FF1) except that the fourth pulse signal line (PS4), instead of the first pulse signal line (PS1), is electrically connected to the second flip-flop (FF2). Thus, the above-mentioned description of the first flip-flop (FF1) applies to detailed description of the circuit operation of the second flip-flop (FF2). In this period, the second flip-flop (FF2) outputs an L-level potential which is the potential of the fourth pulse signal line (PS4) in this period.

In the subsequent period, the potential of the first pulse signal (PS1) is decreased to an L level and the potential of the fourth pulse signal line (PS4) is increased to an H level. As a result, the output signal (FF1out) of the first flip-flop is decreased to an L level. An H-level potential which is the potential of the fourth pulse signal line (PS4) is outputted as the output signal (FF2out) of the second flip-flop.

The output signal (FF2out) of the second flip-flop is inputted to the third flip-flop (not illustrated) and to the gate terminals of the transistors 132 and 134 included in the first flip-flop (FF1). Thus, the transistors 132 and 134 included in the first flip-flop (FF1) are turned on. Accordingly, the potential of the gate terminal of the transistor 132 (the node C) is set to an L level, and the output signal (FF1out) of the first flip-flop is changed from the L level of the first pulse signal (PS1) via the transistor 133 in this period to an L level of the low power supply potential (VSS) via the transistor 134.

In the subsequent period, the potential of the fourth pulse signal line (PS4) is decreased to an L level. That is, the output signal (FF2out) of the second flip-flop is decreased to an L level. Thus, the transistors 132 and 134 included in the first flip-flop (FF1) are turned off. Such a state is continued until an H-level potential is inputted to the input terminal of the first flip-flop (FF1) again.

In the above-mentioned manner, the first flip-flop (FF1) illustrated in FIG. 7A can output a signal which is inputted with a half clock cycle delay. Therefore, the first flip-flop (FF1) can be applied to the flip-flop in this embodiment.

Note that this embodiment or part of this embodiment can be freely combined with the other embodiments or part of the other embodiments.

Embodiment 2

In this embodiment, an example of a transistor which is applicable to the shift register described in Embodiment 1 will be described.

Figure 8A:
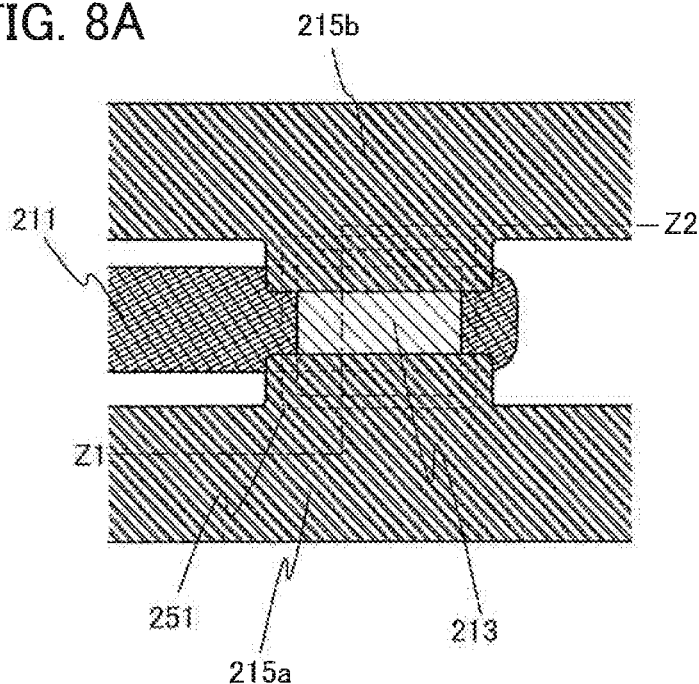
FIGS. 8A to 8C are a top diagram and cross-sectional diagrams, respectively, illustrating a transistor described in Embodiment 2.
Figure 8B:
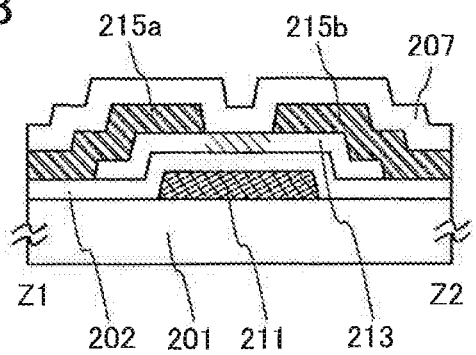
Figure 8C:
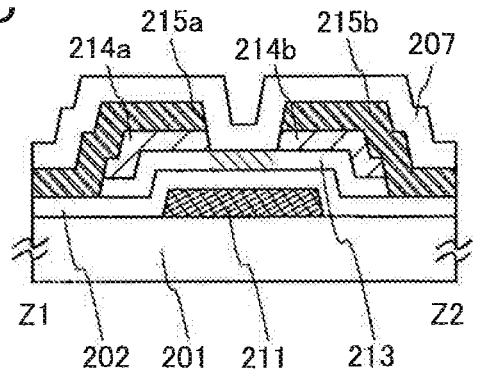

Examples of structures of the transistors of this embodiment will be described with reference to FIGS. 8A to 8C. FIGS. 8A to 8C illustrate examples of the structures of the transistors of this embodiment. FIG. 8A is a top diagram and FIG. 8B is a cross-sectional diagram taken along line Z1-Z2 in FIG. 8A.

The transistor in FIGS. 8A and 8B includes a conductive layer 211 over a substrate 201, an insulating layer 202 over the conductive layer 211, an oxide semiconductor layer 213 over the insulating layer 202, and a conductive layer 215a and a conductive layer 215b over the oxide semiconductor layer 213.

Note that in the transistor, the conductive layer 211 serves as a gate terminal, the insulating layer 202 serves as a gate insulating layer, one of the conductive layers 215a and 215b serves as a source terminal, and the other of the conductive layers 215a and 215b serves as a drain terminal. The oxide semiconductor layer 213 includes a channel formation region. The oxide semiconductor layer 213 is subjected to dehydration or dehydrogenation treatment when formed.

Further, as for the transistor in FIGS. 8A and 8B, the oxide semiconductor layer 213 is subjected to dehydration or dehydrogenation treatment, and moreover, an oxide insulating layer 207 is formed in contact with part of the oxide semiconductor layer 213. In the transistor including the oxide semiconductor layer 213 as a channel formation region, in which the oxide insulating layer 207 is formed after the dehydration or dehydrogenation treatment is performed, the threshold voltage (Vth) shift due to long-term use and large load hardly occurs and thus reliability is high.

Note that a nitride insulating layer may be provided over the oxide insulating layer 207. It is preferable that the nitride insulating layer be in contact with the insulating layer 202 provided below the oxide insulating layer 207 or an insulating layer serving as a base, so that impurities such as moisture, hydrogen ions, and OH⁻ from the vicinity of side surfaces of the substrate are prevented from entering. In particular, it is effective to use a silicon nitride layer for the insulating layer 202 in contact with the oxide insulating layer 207 or the insulating layer serving as a base. That is, when the silicon nitride layers are provided so as to surround a lower surface, an upper surface, and side surfaces of the oxide semiconductor layer 213, reliability of the transistor is improved.

Further, a planarization insulating layer may be provided over the oxide insulating layer 207 (over the nitride insulating layer in the case where the nitride insulating layer is provided).

Alternatively, as illustrated in FIG. 8C, the transistor may have a structure in which an oxide conductive layer 214a and an oxide conductive layer 214b are provided over parts of the oxide semiconductor layer 213, the conductive layer 215a is provided so as to be in contact with the oxide conductive layer 214a, and the conductive layer 215b is provided so as to be in contact with the oxide conductive layer 214b.

The oxide conductive layer 214a and the oxide conductive layer 214b have conductivity higher than that of the oxide semiconductor layer 213 and serves as a source region (also referred to as a low-resistance source region) and a drain region (also referred to as a low-resistance drain region) of the transistor 251.

As a material of the oxide conductive film used for forming the oxide conductive layer 214a and the oxide conductive layer 214b, a conductive material having a light-transmitting property with respect to visible light, such as an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—Sn—O-based metal oxide, an In—O-based metal oxide, an Sn—O-based metal oxide, or a Zn—O-based metal oxide, can be employed. The thickness of the oxide conductive film is selected as appropriate in the range of greater than or equal to 1 nm and less than or equal to 300 nm. In the case of employing a sputtering method, film deposition is performed with the use of a target containing $SiO_2$ at greater than or equal to 2 wt % and less than or equal to 10 wt %, so that $SiO_x$ (x>0) which hinders crystallization is contained in the light-transmitting conductive film. Thus, the oxide semiconductor layer 213 can be prevented from being crystallized in heat treatment for dehydration or dehydrogenation performed later.

For example, in the case where an In—Ga—Zn—O-based film is used for the oxide semiconductor layer, the oxide semiconductor layer 213 serving as a channel formation region and the oxide conductive layer 214a and the oxide conductive layer 214b can be separately formed under different deposition conditions.

For example, in the case where the deposition is performed by a sputtering method, the oxide conductive layer 214a and the oxide conductive layer 214b which are formed using an oxide semiconductor film formed in an argon gas each have n-type conductivity and an activation energy (ΔE) of greater than or equal to 0.01 eV and less than or equal to 0.1 eV.

Note that in this embodiment, the oxide conductive layers 214a and 214b are In—Ga—Zn—O-based films and include at least amorphous components. Moreover, the oxide conductive layers 214a and 214b may include crystal grains (nanocrystals). The crystal grains in the oxide conductive layers 214a and 214b have a diameter of approximately 1 nm to 10 nm, typically approximately 2 nm to 4 nm.

The oxide conductive layers 214a and 214b are not necessarily provided, but when the oxide conductive layers 214a and 214b are provided between the oxide semiconductor layer 213 serving as a channel formation region and the conductive layers 215a to 215d serving as a source terminal and a drain terminal, good electrical junctions can be obtained and the transistor 251 can operate stably. Further, excellent mobility can be maintained even when the drain voltage is high.

Figure 9A:
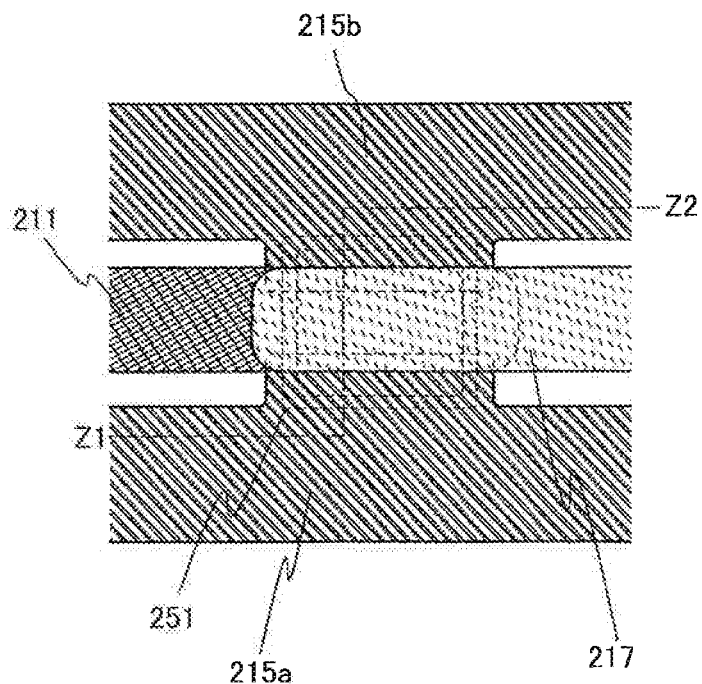
FIGS. 9A and 9B are a top diagram and a cross-sectional diagram, respectively, of a transistor described in Embodiment 2.
Figure 9B:
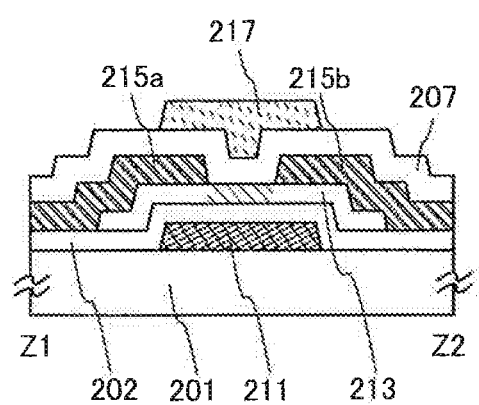

Alternatively, the transistor in FIGS. 8A and 8B may have a structure in FIGS. 9A and 9B, in which a conductive layer 217 is provided over the oxide semiconductor layer 213 with the oxide insulating layer 207 therebetween (with the oxide insulating layer 207 and the nitride insulating layer therebetween in the case where the nitride insulating layer is provided). FIGS. 9A and 9B illustrate an example of the structure of the transistor of this embodiment. FIG. 9A is a top diagram of the transistor and FIG. 9B is a cross-sectional diagram taken along line Z1-Z2 in FIG. 9A. The conductive layer 217 functions as a second gate terminal. A second gate voltage is applied to the conductive layer 217, whereby the threshold voltage of the transistor 251 can be controlled. In the case where a planarization insulating layer is provided, the conductive layer 217 can be provided over the planarization insulating layer.

For example, when a voltage of the second gate terminal is higher than that of the source terminal, the threshold voltage of the transistor is shifted to a negative side; when a voltage is lower than that of the source terminal, the threshold voltage of the transistor is shifted to a positive side.

As illustrated in FIGS. 8A to 8C and FIGS. 9A and 9B as examples, the transistors of this embodiment are transistors each including an oxide semiconductor layer serving as a channel formation region. Accordingly, the transistors have mobility higher than that of the conventional transistor including amorphous silicon in a channel formation region, and thus high-speed operation is possible.

Figure 10A:
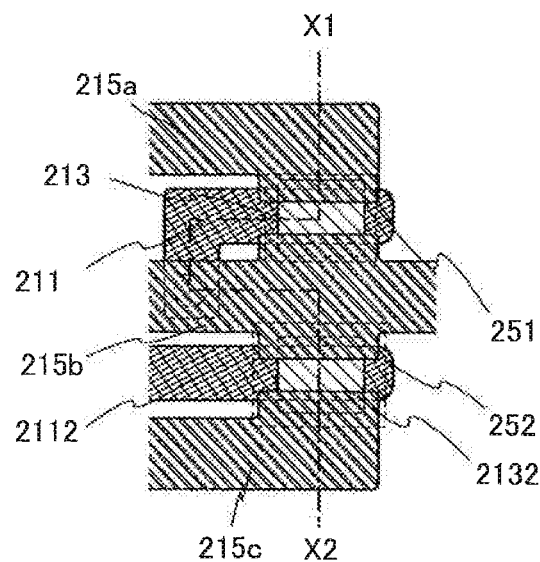
FIGS. 10A and 10B are a top diagram and a cross-sectional diagram, respectively, of a plurality of transistors described in Embodiment 2.
Figure 10B:
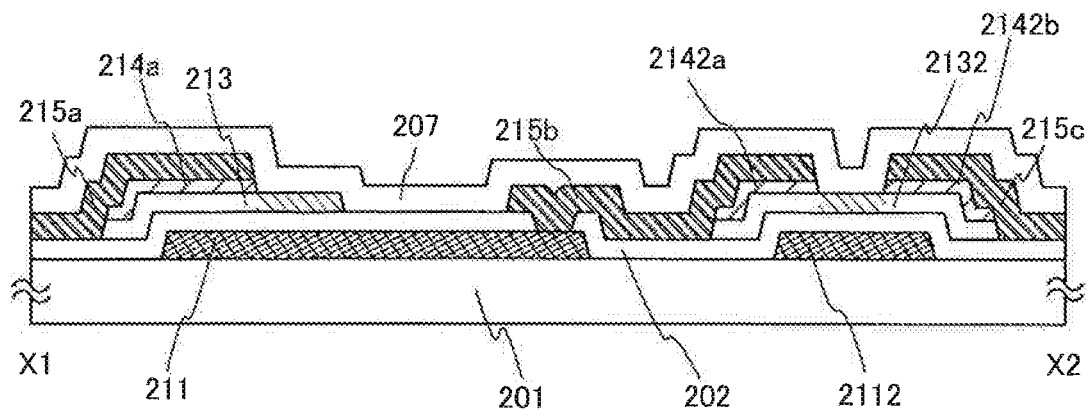

One embodiment in the case where a plurality of transistors in FIGS. 8A and 8C is used will be described with reference to FIGS. 10A and 10B. As an example, FIGS. 10A and 10B illustrate a structure of the plurality of transistors which are applicable to the shift register of one embodiment of the present invention. FIG. 10A is a top diagram of two transistors and FIG. 10B is a cross-sectional diagram taken along line X1-X2 in FIG. 10A.

The transistor 251 and a transistor 252 are illustrated in FIG. 10A. Note that as an example, a structure is illustrated in which an oxide conductive layer is provided between an oxide semiconductor layer and the conductive layer serving as a source terminal or a drain terminal.

The transistor 251 is the transistor illustrated in FIGS. 8A and 8C. Therefore, the above description is to be referred to.

The transistor 252 includes a conductive layer 211 over the substrate 201; an insulating layer 202 over the conductive layer 211; an oxide semiconductor layer 213 over the insulating layer 202; oxide conductive layers 214a and 214b over the oxide semiconductor layer 213; and conductive layers 215a and 215b.

In the transistor 252, the conductive layer 211 serves as a gate terminal, the insulating layer 202 serves as a gate insulating layer, the oxide conductive layers 214a and 214b the conductivity of which is higher than that of the oxide semiconductor layer 213 each serve as a source region (also referred to as a low-resistance source region) or a drain region (also referred to as a low-resistance drain region), and the conductive layers 215a and 215b each serve as a source terminal or a drain terminal. The oxide semiconductor layer 213 includes a channel formation region. Note that the oxide semiconductor layer 213 is subjected to dehydration or dehydrogenation treatment when the oxide semiconductor layer 213 is formed.

The transistors 251 and 252 in FIGS. 10A and 10B are provided with an oxide insulating layer 207 to be in contact with part of the oxide semiconductor layer 213 and part of the oxide semiconductor layer 2132, respectively, in addition to performing dehydration or dehydrogenation treatment on the oxide semiconductor layers.

Further, the conductive layer 211 of the transistor 251 is in contact with the conductive layer 215b in an opening portion formed in the gate insulating layer 202. Accordingly, favorable contact can be obtained, which leads to reduction in contact resistance. Thus, the number of openings can be reduced, which results in reducing the area occupied by openings. Therefore, a logic circuit (e.g., an inverter) which has this structure with the use of two transistors can be formed, for example.

As illustrated in FIGS. 10A and 10B, in the shift register described in Embodiment 1, a conductive layer serving as a gate terminal of a transistor may be electrically connected to a source terminal or a drain terminal of another transistor in an opening portion formed in an insulating layer serving as a gate insulating layer.

Next, an example of a method for manufacturing the transistor illustrated in FIGS. 8A and 8B is described with reference to FIGS. 11A to 11D. FIGS. 11A to 11D are cross-sectional diagrams illustrating an example of a method for manufacturing the transistor illustrated in FIGS. 8A and 8B.

In the below description, the word "film" means something formed on the entire surface of a substrate to be processed into a desired shape in a subsequent photolithography step or the like, and something before the processing. The word "layer" means something obtained by processing and shaping a "film" into a desired shape by a photolithography step or the like, or something that is to be formed on the entire surface of a substrate.

First, the substrate 201 is prepared. A conductive film is formed over the substrate 201, and then the conductive layer 211 is formed by a first photolithography step (see FIG. 11A). Note that the conductive layer 211 is preferably tapered. When the conductive layer 211 is tapered, adhesion between the conductive layer 211 and a film formed on the conductive layer 211 can be increased.

The substrate 201 needs to have an insulating surface and heat resistance high enough to withstand at least heat treatment to be performed later. As the substrate 201, a glass substrate or the like can be used, for example.

As the glass substrate, in the case where the temperature of the heat treatment to be performed later is high, the one whose strain point is 730° C. or higher is preferably used. As the glass substrate, a glass material such as aluminosilicate glass, aluminoborosilicate glass, or barium borosilicate glass is used. In general, by containing a larger amount of barium oxide (BaO) than boric acid ($B_2O_3$), more practical heat-resistant glass can be obtained. Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate may be used for the substrate 201, instead of the glass substrate. Alternatively, a crystallized glass substrate or the like may be used.

An insulating layer serving as a base layer may be provided between the substrate 201 and the conductive layer 211. The base layer has a function of preventing diffusion of an impurity element from the substrate 201 and can be formed to have a single-layer structure or a stacked structure of one or more of a silicon nitride layer, a silicon oxide layer, a silicon nitride oxide layer, and a silicon oxynitride layer.

As an example of a material of the conductive film for forming the conductive layer 211, a metal material such as molybdenum, titanium, chromium, tantalum, tungsten, aluminum, copper, neodymium, or scandium or an alloy material containing any of these materials as a main component can be used. The conductive film for forming the conductive layer 211 can be formed with a single film containing one or more of these materials or a stacked film thereof.

As the conductive film for forming the conductive layer 211, a stacked film of three layers in which a titanium layer, an aluminum layer, and a titanium layer are stacked in this order, or a stacked film of three layers in which a molybdenum layer, an aluminum layer, and a molybdenum layer are stacked in this order is preferably used. A single-layer film, a stacked film of two layers, or a stacked film of four or more layers may also be used as the conductive film. When a stacked conductive film of a titanium film, an aluminum film, and a titanium film is used as the conductive film, etching can be performed by a dry etching method with the use of a chlorine gas.

Next, the insulating layer 202 is formed over the conductive layer 211.

The insulating layer 202 can be formed to have a single layer of a silicon oxide layer, a silicon nitride layer, a silicon oxynitride layer, or a silicon nitride oxide layer or a stacked layer thereof by a plasma CVD method, a sputtering method, or the like. For example, a silicon oxynitride layer may be formed by a plasma CVD method with the use of $SiH_4$, oxygen, and nitrogen as a deposition gas. The thickness of the insulating layer 202 is greater than or equal to 100 nm and less than or equal to 500 nm; in the case where the insulating layer 202 is formed using a stacked layer, for example, a first insulating layer with a thickness of greater than or equal to 50 nm and less than or equal to 200 nm and a second insulating layer with a thickness of greater than or equal to 5 nm and less than or equal to 300 nm are stacked. When a silicon oxide film which is formed using a silicon target doped with phosphorus or boron is used for the insulating layer 202, entry of impurities (such as moisture, hydrogen ions, and $OH^-$) can be suppressed.

In this embodiment, the insulating layer 202 is formed using a silicon nitride film with a thickness of 200 nm by a plasma CVD method as an example.

Next, an oxide semiconductor film is formed over the insulating layer 202. The thickness of the oxide semiconductor film is preferably greater than or equal to 2 nm and less than or equal to 200 nm. For example, when the thickness of the oxide semiconductor film is as small as 50 nm or less, the oxide semiconductor film can be in an amorphous state even when heat treatment for dehydration or dehydrogenation is performed after formation of the oxide semiconductor film. By making the thickness of the oxide semiconductor film small, crystallization of the oxide semiconductor film can be suppressed when heat treatment is performed after the formation of the oxide semiconductor film.

Note that before the oxide semiconductor film is formed by a sputtering method, particles which are attached on a surface of the insulating layer 202 may be removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is generated in the vicinity of the substrate to modify a surface. Note that instead of an argon atmosphere, a nitrogen atmosphere, a helium atmosphere, an oxygen atmosphere, or the like may be used.

As the oxide semiconductor film, any of the following can be used: an In—Ga—Zn—O-based oxide semiconductor film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—Sn—O-based oxide semiconductor film, an In—O-based oxide semiconductor film, an Sn—O-based oxide semiconductor film, and a Zn—O-based oxide semiconductor film. In this embodiment, the oxide semiconductor film is formed using an In—Ga—Zn—O-based metal oxide semiconductor target by a sputtering method. Alternatively, the oxide semiconductor film can be formed by a sputtering method in a rare gas (typically, argon) atmosphere, an oxygen atmosphere, or a mixed atmosphere of a rare gas (typically, argon) and oxygen. In the case of employing a sputtering method, film deposition may be performed using a target containing $SiO_2$ at greater than or equal to 2 wt % and less than or equal to 10 wt % and SiOx (x>0) which hinders crystallization may be contained in the oxide semiconductor film. Accordingly, crystallization of the oxide semiconductor layer can be suppressed in heat treatment for dehydration or dehydrogenation which is to be performed later.

Here, the oxide semiconductor film is formed using a metal oxide semiconductor target for film deposition including In, Ga, and Zn (at a composition ratio of $In_2O_3:Ga_2O_3$: ZnO=1:1:1 [mol], In:Ga:Zn=1:1:0.5 [at]) under the following condition: the distance between the substrate and the target is 100 mm, the pressure is 0.6 Pa, the direct-current (DC) power supply is 0.5 kW, and the atmosphere is oxygen (the proportion of the oxygen flow is 100%). Note that a pulse direct-current (DC) power supply is preferable because powder substances (also referred to as a particle generated at the time of film deposition can be reduced and the film thickness can be made uniform. In this embodiment, as the oxide semiconductor film, an In—Ga—Zn—O-based film is formed by a sputtering method with the use of an In—Ga—Zn—O-based metal oxide semiconductor target for film deposition.

As the composition ratio of the metal oxide semiconductor target, $In_2O_3:Ga_2O_3$:ZnO=1:1:0.5 [mol], $In_2O_3:Ga_2O_3$: ZnO=1:1:0.25 [at], $In_2O_3:Ga_2O_3$:ZnO=1:1:2 [mol], $In_2O_3$: $Ga_2O_3$:ZnO=1:1:1 [at], or the like can be employed instead of the above-mentioned composition ratio.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

Further, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Moreover, there are a sputtering apparatus provided with a magnet system inside a chamber and used for a magnetron sputtering method, and a sputtering apparatus used for an ECR sputtering method in which plasma generated with the use of microwaves is used without using glow discharge.

As a film deposition method employing a sputtering method, there are a reactive sputtering method in which a target substance and a sputtering gas component are chemically reacted with each other during film formation to form a thin film of a compound thereof, and a bias sputtering method in which voltage is also applied to a substrate during film deposition.

As an evacuation means of the deposition chamber where sputtering is performed, a cryopump is preferably used. When the cryopump is used for evacuation, impurities such as moisture in the deposition chamber can be removed.

Figure 11A:
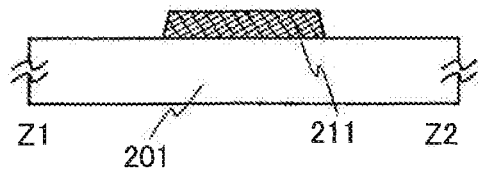
FIGS. 11A to 11D are cross-sectional diagrams illustrating a process for manufacturing a transistor described in Embodiment 2.
Figure 11B:
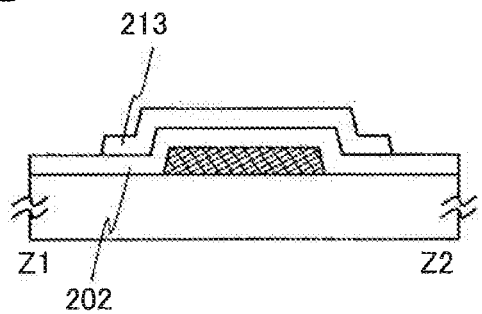
Figure 11C:
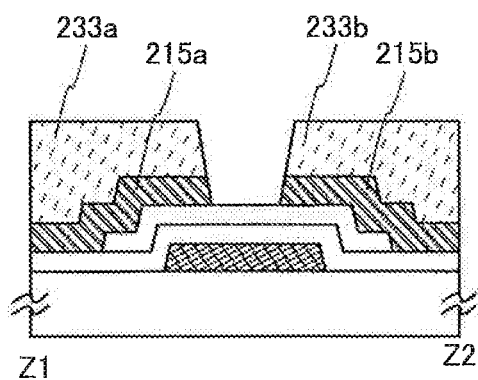
Figure 11D:
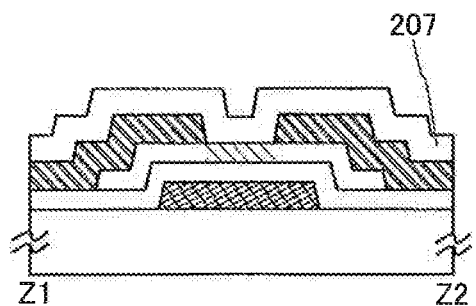

Next, the oxide semiconductor film is processed into an island shape by a second photolithography step to form the oxide semiconductor layer 213 (see FIG. 11B). Note that after the second photolithography step, the oxide semiconductor layer 213 may be subjected to heat treatment (at higher than or equal to 400° C. and lower than 750° C.) in an inert gas atmosphere (e.g., nitrogen, helium, neon, or argon) so that impurities such as hydrogen and water contained in the layer are removed.

Next, the oxide semiconductor layer 213 is dehydrated or dehydrogenated. First heat treatment for dehydration or dehydrogenation is performed at a temperature higher than or equal to 400° C. and lower than 750° C., preferably higher than or equal to 425° C. and lower than 750° C. Note that in the case of the temperature that is 425° C. or higher, the heat treatment time may be one hour or shorter, whereas in the case of the temperature lower than 425° C., the heat treatment time is longer than one hour. In this embodiment, the substrate is introduced into an electric furnace, which is one of heat treatment apparatuses, and heat treatment is performed on the oxide semiconductor layer 213 in a nitrogen atmosphere. Then, the oxide semiconductor layer 213 is not exposed to air, which prevents entry of water and hydrogen into the oxide semiconductor layer 213. In this embodiment, slow cooling is performed from the heating temperature at which the oxide semiconductor layer 213 is subjected to dehydration or dehydrogenation to a temperature low enough to prevent water from entering again, specifically to a temperature that is lower than the heating temperature by 100° C. or more, in one furnace. The atmosphere is not limited to a nitrogen atmosphere, and any atmosphere may be employed as long as it is an inert gas atmosphere such as helium, neon, or argon.

Note that the heat treatment apparatus is not limited to an electric furnace, and may have a device for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment with a high-temperature gas. As the gas, an inert gas which does not react with an object to be processed by heat treatment is used. For example, nitrogen or a rare gas such as argon is used.

When the oxide semiconductor layer 213 is subjected to heat treatment at a temperature of higher than or equal to 400° C. and lower than 750° C., the dehydration or dehydrogenation of the oxide semiconductor layer can be achieved; thus, water ($H_2O$) can be prevented from being contained again in the oxide semiconductor layer later.

In the first heat treatment, it is preferable that water, hydrogen, and the like be not contained in nitrogen or a rare gas such as helium, neon, or argon. Further, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is preferably less than or equal to 1 ppm, more preferably less than or equal to 0.1 ppm).

The oxide semiconductor layer 213 includes microcrystalline grains and an amorphous region, or includes only microcrystalline grains, depending on conditions of the first heat treatment or a material of the oxide semiconductor layer 213. For example, the oxide semiconductor layer 213 may become a microcrystalline semiconductor layer having a crystallinity of 90% or more, or 80% or more. Further, depending on conditions of the first heat treatment or a material of the oxide semiconductor layer 213, the oxide semiconductor layer 213 may become an amorphous oxide semiconductor layer containing no crystalline grains.

The oxide semiconductor layer 213 is changed to an oxygen-deficient type after the first heat treatment so as to be low-resistance. The oxide semiconductor film after the first heat treatment has a higher carrier concentration than the oxide semiconductor layer shortly after the formation and preferably has a carrier concentration of $1 \times 10^{18}/cm^3$ or more.

Note that the conductive layer 211 becomes a microcrystalline layer or a polycrystalline layer depending on the conditions of the first heat treatment or the material of the conductive layer 211 in some cases. For example, in the case of using a film of an alloy of indium oxide and tin oxide as the conductive layer 211, it is crystallized by the first heat treatment at 450° C. for one hour, whereas in the case of using a film of an alloy of indium oxide and tin oxide containing silicon oxide as the conductive layer 211, it is not crystallized.

The first heat treatment can be performed on the oxide semiconductor layer 213 which has not been processed into the island-shaped oxide semiconductor layer. In that case, the substrate is taken out of the heat treatment apparatus after the first heat treatment, and then a photolithography step is performed.

Next, a conductive film is formed over the insulating layer 202 and the oxide semiconductor layer 213.

For the conductive film, an element selected from titanium (Ti), molybdenum (Mo), tungsten (W), aluminum (Al), chromium (Cr), copper (Cu), and tantalum (Ta), an alloy containing any of these elements as a component, a compound containing any of these elements in combination, or the like is used. The conductive film is not limited to a single layer containing the above element and can be formed in a stacked layer of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a titanium film, a titanium nitride film may be used.

In the case where heat treatment at 200° C. to 600° C. is performed later, it is preferable that the conductive film have heat resistance high enough to withstand the heat treatment. For example, it is preferable to use an aluminum alloy to which an element for preventing hillocks is added or a conductive film stacked with a heat-resistance conductive film. As the formation method of the conductive film, a sputtering method, a vacuum evaporation method (e.g., an electron beam evaporation method), an arc discharge ion plating method, or a spray method is used. Alternatively, the conductive film may be formed by discharging a conductive nanopaste of silver, gold, copper, or the like by a screen printing method, an ink-jet method, or the like and baking the nanopaste.

Next, a third photolithography step is performed so that a resist mask 233a and a resist mask 233b are formed. Then the conductive film is selectively etched, so that the conductive layer 215a and the conductive layer 215b are formed (see FIG. 11C).

In the third photolithography step, only part of the conductive film which is on the oxide semiconductor layer 213 is selectively removed. For example, when an ammonia peroxide mixture (hydrogen peroxide:ammonia:water=5:2:2 in a weight ratio) or the like is used as an alkaline etchant in order to selectively remove only part of the metal conductive film, which is on the In—Ga—Zn—O-based oxide semiconductor layer, the metal conductive film can be selectively removed, and the oxide semiconductor layer formed of an oxide semiconductor can be left.

In the third photolithography step, an exposed region of the oxide semiconductor layer 213 is etched in some cases depending on an etching condition. In that case, the oxide semiconductor layer in a region which is sandwiched between the conductive layer 215a and the conductive layer 215b is thinner than the oxide semiconductor layer in a region which overlaps with the conductive layer 215a and the conductive layer 215b over the conductive layer 211.

Next, the oxide insulating layer 207 is formed over the insulating layer 202 and the oxide semiconductor layer 213. At this stage, part of the oxide semiconductor layer 213 is in contact with the oxide insulating layer 207. Note that a region of the oxide semiconductor layer, which overlaps with the conductive layer 211 with the insulating layer 202 therebetween, is a channel formation region.

The oxide insulating layer 207 can be formed to have a thickness of at least 1 nm by a method with which impurities such as water and hydrogen are not mixed into the oxide insulating layer, such as a sputtering method, as appropriate. In this embodiment, a silicon oxide film is formed as the oxide insulating layer by a sputtering method. The substrate temperature in deposition may be higher than or equal to room temperature and lower than or equal to 300° C. The substrate temperature is 100° C. in this embodiment. The silicon oxide film can be formed by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, with the use of a silicon target, a silicon oxide film can be formed by a sputtering method in a mixed atmosphere containing oxygen and a rare gas. The oxide insulating layer which is formed to be in contact with the oxide semiconductor layer whose resistance is reduced is formed using an inorganic insulating film which does not contain impurities such as moisture, hydrogen ions, and OH⁻ and blocks entry of such impurities from the outside; a silicon oxide film, a silicon nitride oxide film, an aluminum oxide film, an aluminum oxynitride film, or the like is typically used. Note that an oxide insulating layer formed by a sputtering method is particularly dense, and even a single layer can be used as a protective film for suppressing a phenomenon in which impurities are diffused into a layer in contact therewith. Also, a target doped with phosphorus (P) or boron (B) can be used so that phosphorus (P) or boron (B) is added to the oxide insulating layer.

In this embodiment, the film deposition is performed by a pulsed DC sputtering method using a columnar polycrystalline, boron-doped silicon target which has a purity of 6N (the resistivity is 0.01 Ω·cm), in which the distance between the substrate and the target (T-S distance) is 89 mm, the pressure is 0.4 Pa, the direct-current (DC) power source is 6 kW, and the atmosphere is oxygen (the proportion of the oxygen flow is 100%). The film thickness is 300 nm.

The oxide insulating layer 207 is provided on the channel formation region of the oxide semiconductor layer 213 and also functions as a channel protective layer.

Next, second heat treatment (for example, at higher than or equal to 200° C. and lower than or equal to 400° C., preferably, at higher than or equal to 250° C. and lower than or equal to 350° C.) may be performed in an inert gas atmosphere or a nitrogen atmosphere. For example, the second heat treatment is performed in a nitrogen atmosphere at 250° C. for one hour. When the second heat treatment is performed, the oxide semiconductor layer 213 is heated while part thereof is in contact with the oxide insulating layer 207 and other parts thereof are in contact with the conductive layer 215a and the conductive layer 215b.

When the second heat treatment is performed while the oxide semiconductor layer 213 whose resistance is reduced in the first heat treatment is in contact with the oxide insulating layer 207, the region in contact with the oxide insulating layer 207 becomes in an oxygen-excess state. Accordingly, the region of the oxide semiconductor layer 213, which is in contact with the oxide insulating layer 207, increases resistance (becomes an i-type) in a depth direction of the oxide semiconductor layer 213 (see FIG. 11D).

The timing of performing the second heat treatment is not limited to the timing shortly after the third photolithography step as long as it is after the third photolithography step.

Thus, the transistor illustrated in FIGS. 8A and 8B.

Note that this embodiment or part of this embodiment can be freely combined with the other embodiments or part of the other embodiments.

Embodiment 3

In this embodiment, another example of a transistor which is applicable to the shift register described in Embodiment 1 and different from the transistor described in Embodiment 2 will be described.

Figure 12A:
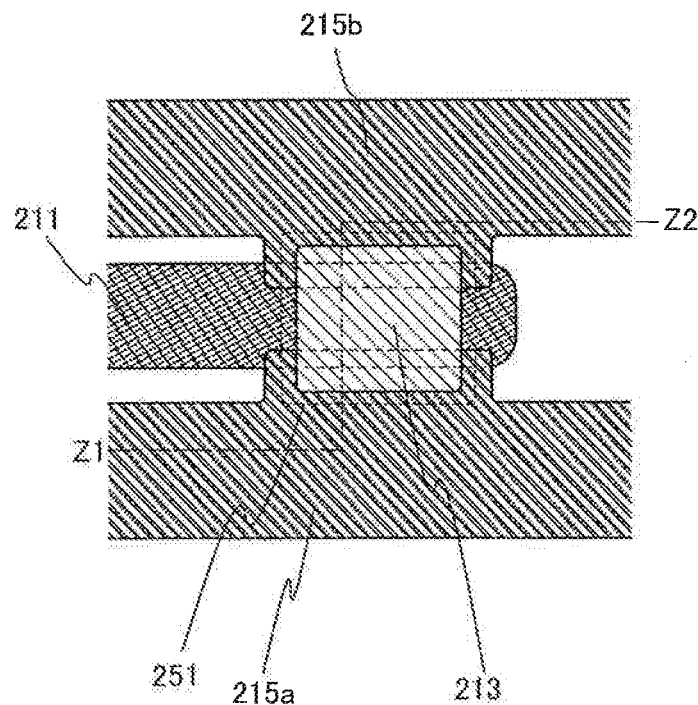
FIGS. 12A and 12B are a top diagram and a cross-sectional diagram, respectively, of a plurality of transistors described in Embodiment 3.
Figure 12B:
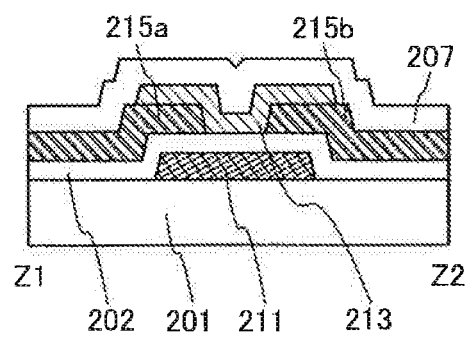

An example of a structure of the transistor of this embodiment will be described with reference to FIGS. 12A and 12B. FIGS. 12A and 12B illustrate an example of a structure of the transistor of this embodiment. FIG. 12A is a top diagram of the transistor and FIG. 12B is a cross-sectional diagram taken along line Z1-Z2 in FIG. 12A.

The transistor illustrated in FIGS. 12A and 12B includes the conductive layer 211 over the substrate 201; the insulating layer 202 over the conductive layer 211; the conductive layers 215a and 215b over the insulating layer 202; the oxide semiconductor layer 213 over the insulating layer 202 and the conductive layers 215a and 215b.

In the transistor, the conductive layer 211 serves as a gate terminal, the insulating layer 202 serves as a gate insulating layer, one of the conductive layers 215a and 215b serves as a source terminal, and the other of the conductive layers 215a and 215b serves as a drain terminal. The oxide semiconductor layer 213 includes a channel formation region. Note that the oxide semiconductor layer 213 is subjected to dehydration or dehydrogenation treatment when the oxide semiconductor layer 213 is formed.

Further, as for the transistor in FIGS. 12A and 12B, the oxide semiconductor layer 213 is subjected to dehydration or dehydrogenation treatment, and moreover, the oxide insulating layer 207 is formed to be in contact with part of the oxide semiconductor layer 213. A transistor including the oxide semiconductor layer 213, which undergoes dehydration or dehydrogenation treatment and then brought into contact with the oxide insulating layer 207 formed thereon, as a channel formation region has high reliability because a threshold voltage (V-th) shift due to a long-term use or high load hardly occurs.

Note that a nitride insulating layer may be provided over the oxide insulating layer 207. It is preferable that the nitride insulating layer be in contact with the insulating layer 202 provided below the oxide insulating layer 207 or an insulating layer serving as a base, so that impurities such as moisture, hydrogen ions, and OH⁻ from the vicinity of side surfaces of the substrate are prevented from entering. In particular, it is effective to use a silicon nitride layer for the insulating layer 202 in contact with the oxide insulating layer 207 or the insulating layer serving as a base. That is, when the silicon nitride layers are provided so as to surround a lower surface, an upper surface, and side surfaces of the oxide semiconductor layer 213, reliability of the transistor is improved.

Further, a planarization insulating layer may be provided over the oxide insulating layer 207 (over the nitride insulating layer in the case where the nitride insulating layer is provided).

As in FIGS. 9A and 9B, the transistor 251 in FIGS. 12A and 12B may have a structure in which a conductive layer is provided in a region which overlaps with the oxide semiconductor layer 213 over the oxide insulating layer 207 (over the planarization insulating layer in the case where the planarization insulating layer is provided). The conductive layer serves as a second gate terminal. Second gate voltage is applied to the conductive layer, whereby the threshold voltage of the transistor can be controlled.

Note that the planarization insulating layer is not necessarily provided. When the planarization insulating layer is not provided, a conductive layer serving as the second gate terminal can be formed over the oxide insulating layer 207 (over the nitride insulating layer in the case where the nitride insulating layer is formed).

For example, when the potential of the second gate terminal is higher than the potential of the source terminal, the threshold voltage of the transistor shifts in a negative direction. When the potential of the second gate terminal is lower than the potential of the source terminal, the threshold voltage of the transistor shifts in a positive direction.

As illustrated in FIGS. 12A and 12B, the transistor of this embodiment is a so-called bottom-contact transistor in which an oxide semiconductor layer is provided over a conductive layer serving as a source terminal or a drain terminal. Therefore, high-speed operation can be performed since the transistor of this embodiment has higher mobility than that of the conventional transistor including amorphous silicon in a channel formation region. Further, the bottom-contact transistor is applied, so that an area where the oxide semiconductor layer is in contact with the conductive layer serving as the source terminal or the drain terminal can be increased, leading to prevention of peeling or the like.

Note that this embodiment or part of this embodiment can be freely combined with the other embodiments or part of the other embodiments.

Embodiment 4

In this embodiment, another example of a transistor which is applicable to the shift register described in Embodiment 1 and different from the transistors described in Embodiments 2 and 3 will be described.

Figure 13A:
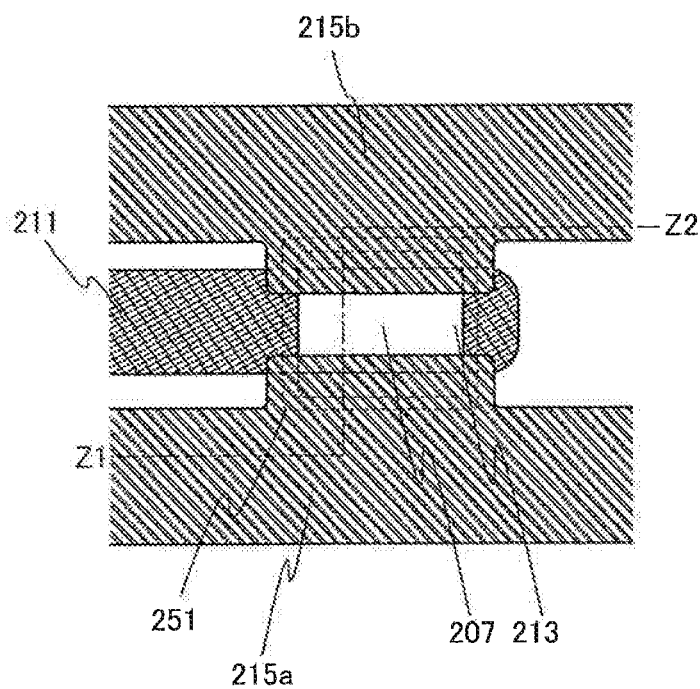
FIGS. 13A and 13B are a top diagram and a cross-sectional diagram, respectively, of a plurality of transistors described in Embodiment 4.
Figure 13B:
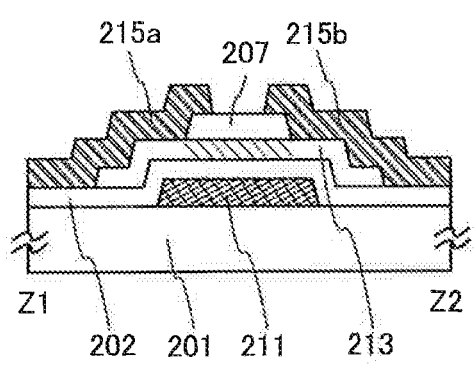

The example of the structure of the transistor of this embodiment will be described with reference to FIGS. 13A and 13B. FIGS. 13A and 13B illustrate an example of the structure of the transistor of this embodiment. FIG. 13A is a top diagram and FIG. 13B is a cross-sectional diagram taken along line Z1-Z2 in FIG. 13A.

As in the transistors illustrated in FIGS. 8A to 8C, the transistor illustrated in FIGS. 13A and 13B includes the conductive layer 211 over the substrate 201, the insulating layer 202 over the conductive layer 211, the oxide semiconductor layer 213 over the insulating layer 202, the conductive layer 215a and the conductive layer 215b over the oxide semiconductor layer 213.

In the transistor, the conductive layer 211 serves as a gate terminal, the insulating layer 202 serves as a gate insulating layer, one of the conductive layers 215a and 215b serves as a source terminal, and the other of the conductive layers 215a and 215b serves as a drain terminal. The oxide semiconductor layer 213 includes a channel formation region. Note that the oxide semiconductor layer 213 is subjected to dehydration or dehydrogenation treatment when the oxide semiconductor layer 213 is formed.

Further, as for the transistor illustrated in FIGS. 13A and 13B, the oxide semiconductor layer 213 is subjected to dehydration or dehydrogenation treatment, and moreover, the oxide insulating layer 207 is provided below the conductive layers 215a and 215b so that the oxide insulating layer 207 is in contact with part of the oxide semiconductor layer 213. The oxide insulating layer 207 in FIGS. 13A and 13B has a function of a channel protective layer.

A nitride insulating layer may be provided over the oxide insulating layer 207 and the conductive layers 215a and 215b. It is preferable that the nitride insulating layer 207 be in contact with the insulating layer 202 provided below the oxide insulating layer 207 or an insulating layer serving as a base, so that impurities such as moisture, hydrogen ions, and OH⁻ from the vicinity of side surfaces of the substrate are prevented from entering. In particular, it is effective to use a silicon nitride layer for the insulating layer 202 in contact with the oxide insulating layer 207 or the insulating layer serving as a base. That is, when the silicon nitride layers are provided so as to surround a lower surface, an upper surface, and side surfaces of the oxide semiconductor layer 213, reliability of the transistor is improved.

Further, a planarization insulating layer may be provided over the oxide insulating layer 207 and the conductive layers 215a and 215b (over the nitride insulating layer in the case where the nitride insulating layer is provided).

Further, a conductive layer may be provided over the oxide insulating layer 207 (over the planarization insulating layer in the case where the planarization insulating layer is provided) so that the oxide insulating layer 207 is sandwiched between the conductive layer and the oxide semiconductor layer 213. The conductive layer serves as a second gate terminal. Second gate voltage is applied to the conductive layer, whereby the threshold voltage of the transistor 251 can be controlled.

Note that the planarization insulating layer is not necessarily provided. When the planarization insulating layer is not provided, a conductive layer can be formed over the oxide insulating layer 207 (over the nitride insulating layer in the case where the nitride insulating layer is formed).

For example, when the potential of the second gate terminal is higher than the potential of the source terminal, the threshold voltage of the transistor shifts in a negative direction. When the potential of the second gate terminal is lower than the potential of the source terminal, the threshold voltage of the transistor shifts in a positive direction.

Further, as in the transistor in FIG. 8C, the transistor of this embodiment may have a structure in which a pair of oxide conductive layers serving as buffer layers is provided over parts of the oxide semiconductor layer 213, and the conductive layers 215a and 215b which serve as a pair of electrodes are provided so as to be in contact with the pair of the oxide conductive layers.

As described above, the transistors of this embodiment are so-called channel protective transistors each including an insulating layer serving as a channel formation layer over part of the oxide semiconductor layer. Accordingly, the transistors have mobility higher than that of the conventional transistor including amorphous silicon in a channel formation region, and thus high-speed operation is possible.

Note that this embodiment or part of this embodiment can be freely combined with the other embodiments or part of the other embodiments.

Embodiment 5

In this embodiment, an example of a display device including the shift register described in Embodiment 1 is described with reference to FIGS. 14A to 14C.

A variety of display devices, such as a liquid crystal display device or an electroluminescence (hereinafter also referred to as EL) display device, is given as the display device including the shift register described in Embodiment 1. A structure of a display device in this embodiment is described with reference to FIG. 14A. FIG. 14A is a block diagram illustrating a structure of the display device in this embodiment.

Figure 14A:
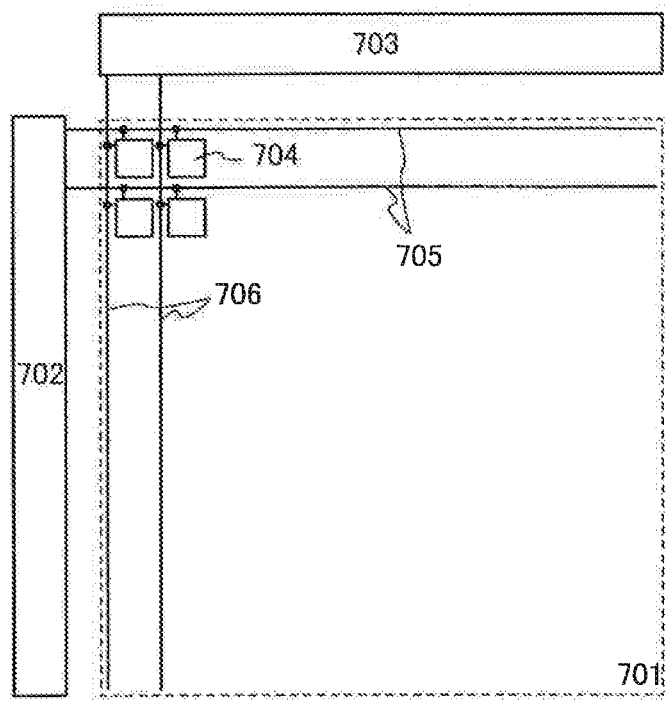
FIGS. 14A to 14C are a block diagram, a block diagram of a scan line driver circuit, and a block diagram of a signal line driver circuit, respectively, of a display device described in Embodiment 5.

The display device illustrated in FIG. 14A includes a pixel portion 701, a scan line driver circuit 702, and a signal line driver circuit 703.

The pixel portion 701 has a dot matrix structure in which a plurality of pixels 704 is provided. Specifically, the plurality of pixels 704 is arranged in the row and column directions. Each of the pixels 704 is electrically connected to the scan line driver circuit 702 through a scan line 705 and electrically connected to the signal line driver circuit 703 through a signal line 706.

The scan line driver circuit 702 is a circuit for selecting the pixel 704 to which a data signal is inputted, and outputs a selection signal to the pixel 704 through the scan line 705.

The signal line driver circuit 703 is a circuit for outputting data written to the pixel 704 as a signal, and outputs pixel data as a signal through the signal line 706 to the pixel 704 selected by the scan line driver circuit 702.

The pixel 704 includes at least a display element and a switching element. A liquid crystal element or a light-emitting element such as an EL element can be applied to the display element, for example. A transistor can be applied to the switching element, for example.

Next, an example of structures of the scan line driver circuit 702 and the signal line driver circuit 703 is described with reference to FIGS. 14B and 14C. FIGS. 14B and 14C are block diagrams illustrating a structure of the driver circuit. FIG. 14B is a block diagram illustrating a structure of the scan line driver circuit 702. FIG. 14C is a block diagram illustrating a structure of the signal line driver circuit 703.

Figure 14B:
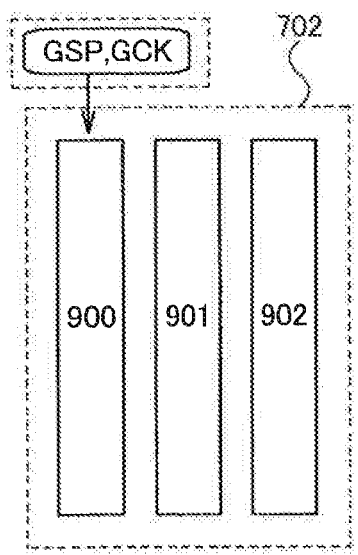

As illustrated in FIG. 14B, the scan line driver circuit 702 includes a shift register 900, a level shifter 901, and a buffer 902.

Signals such as a scan line driver circuit start pulse signal (GSP) and a scan line driver circuit reference clock signal (GCK) are inputted to the shift register 900, and selection signals are sequentially output from sequential logic circuits. As illustrated in Embodiment 1, the shift register 900 in this embodiment includes a plurality of wirings for supplying scan line driver circuit reference clock signals (GCK) in part of the operation period.

Figure 14C:
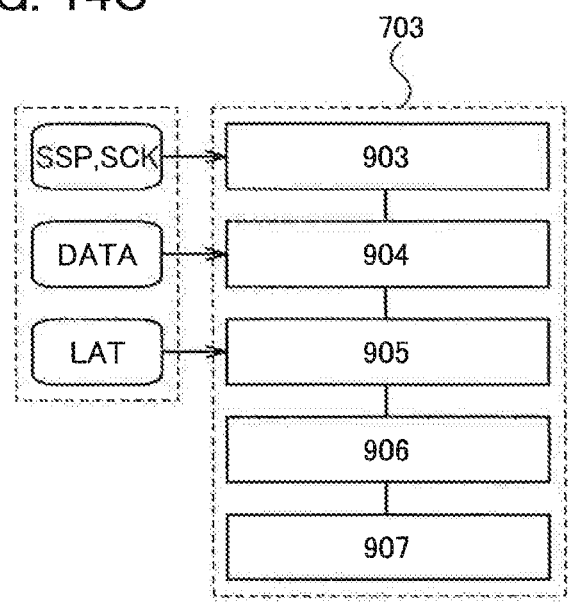

As illustrated in FIG. 14C, the signal line driver circuit 703 includes a shift register 903, a first latch circuit 904, a second latch circuit 905, a level shifter 906, and a buffer 907.

Signals such as a signal line driver circuit start pulse signal (SSP) and a signal line driver circuit reference clock signal (SCK) are inputted to the shift register 903, and selection signals are sequentially output from sequential logic circuits. As in Embodiment 1, the shift register 903 in this embodiment includes a plurality of wirings by which signal line driver circuit reference signals (SCK) are supplied in part of the operation period.

Note that the shift register described in Embodiment 1 may be employed for only one of the shift register 900 and the shift register 903.

A data signal (DATA) is inputted to the first latch circuit 904. The first latch circuit 904 can be constituted using a logic circuit.

The buffer 907 has a function of amplifying a signal and includes an operational amplifier or the like. The buffer 907 can be constituted using a logic circuit.

The second latch circuit 905 can hold a latch (LAT) signal temporally and outputs the held latch signals all at once to the pixel portion 701 in FIG. 14A. This is referred to as line sequential driving. Therefore, in the case of using a pixel in which not line sequential driving but dot sequential driving is performed, the second latch circuit 905 is not necessary. The second latch circuit 905 can be constituted using a logic circuit.

Next, operation of the display device in this embodiment is described.

First, the scan line 705 is selected by the scan line driver circuit 702. A data signal is inputted from the signal line driver circuit 703 to the pixel 704 electrically connected to the selected scan line 705, via the signal line 706. Accordingly, data is written to the pixel 704, and the pixel 704 enters into a display state. The scan lines 705 are sequentially selected by the scan line driver circuit 702; thus, data is written to all the pixels 704. The above is the operation of the display device in this embodiment.

The circuits of the display device illustrated in FIGS. 14A to 14C can be provided over one substrate. Further, the circuits of the display device illustrated in FIGS. 14A to 14C can be configured using transistors having the same conductivity type. Providing the circuits over one substrate leads to the reduction in the size of the display device, and using transistors having the same conductivity type can simplify the process.

Note that this embodiment or part of this embodiment can be freely combined with the other embodiments or part of the other embodiments.

Embodiment 6

In this embodiment, as an example of the display device described in Embodiment 5, a liquid crystal display device is described with reference to FIGS. 15A to 15C.

FIG. 15A is a circuit diagram of a pixel included in the liquid crystal display device in this embodiment. The pixel illustrated in FIG. 15A includes a transistor 821, a liquid crystal element 822, and a capacitor 823.

A gate terminal of the transistor 821 is electrically connected to a scan line 804, and a first terminal of the transistor 821 is electrically connected to a signal line 805. Note that the transistor 821 serves as a selection transistor which controls application of voltage to a liquid crystal element 822 included in the pixel.

One terminal of the liquid crystal element 822 is electrically connected to a second terminal of the transistor 821 and the other terminal of the liquid crystal element 822 is electrically connected to a wiring for supplying a common potential (Vcom) (hereinafter also referred to as a common potential line). The liquid crystal element 822 includes a first electrode which serves as part or the whole of one terminal, a second electrode which serves as part or the whole of the other terminal, and a layer including liquid crystal molecules whose alignment is changed by applying voltage between the first electrode and the second electrode (such a layer is referred to as a liquid crystal layer).

One terminal of the capacitor 823 is electrically connected to the second terminal of the transistor 821 and the other terminal of the capacitor 823 is electrically connected to the common potential line. The capacitor 823 includes a first electrode which serves as part or the whole of one terminal, a second electrode which serves as part or the whole of the other terminal, and a dielectric layer provided between the first electrode and the second electrode. The capacitor 823 has a function of a storage capacitor in a pixel. Note that although the capacitor 823 is not necessarily provided, the provision of the capacitor 823 can reduce adverse effects due to leakage current of the transistor 821.

As a method for driving liquid crystals of the liquid crystal display device in this embodiment, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like are given.

Alternatively, blue-phase liquid crystal for which an alignment film is not necessary may be used. The blue phase is a kind of liquid crystal phase and appears just before phase transition from a cholesteric phase to an isotropic phase when temperature of cholesteric liquid crystal rises. Since the blue phase appears only in a narrow temperature range, a liquid crystal composition in which 5 wt. % or more of a chiral material is mixed is used for the liquid crystal layer in order to improve the temperature range. The liquid crystal composition which contains blue-phase liquid crystal and the chiral material has the following characteristics: the response speed is 10 µs to 100 µs, which is short; alignment treatment is not necessary due to optical isotropy; and viewing angle dependence is low.

When a signal is inputted to a pixel, first, a pixel to which data is written is selected, and in the selected pixel, the transistor 821 is turned on by a signal inputted from the scan line 804.

At this time, a data signal from the signal line 805 is inputted to the pixel via the transistor 821, and the potential of one terminal of the liquid crystal element 822 corresponds to the potential of the data signal. Therefore, the alignment-state of the liquid crystal element 822 is set depending on the voltage applied between one terminal and the other terminal. After data writing, the transistor 821 is turned off by a signal inputted from the scan line 804, the alignment-state of the liquid crystal element 822 is maintained during a display period, and the pixel enters into a display state. The above operation is sequentially performed per scan line 804, and in all the pixels included in the liquid crystal display device.

In displaying moving images in a liquid crystal display device, there is a problem in that an afterimage or motion blur occurs because of slow response of liquid crystal molecules themselves. In order to improve moving image characteristics of the liquid crystal display device, there is a driving technique called black insertion, in which the entire screen is displayed as black every other frame.

Moreover, there is a driving technique called double-frame rate driving, in which a vertical synchronizing frequency is 1.5 times or more, preferably 2 times or more as high as a normal vertical synchronizing frequency.

Further, in order to improve the moving image characteristics of the liquid crystal display device, there is a driving technique in which a plurality of LED (light-emitting diode) light sources, a plurality of EL light sources, or the like are used as backlights to form an area light source, and the light sources forming the area light source are independently lit intermittently in one frame period. For the area light source, LEDs of three kinds or more or an LED which emits white light may be used. Since a plurality of LEDs can be independently controlled, the timing when the LED emits light can be synchronized with the timing when optical modulation of the liquid crystal layer is changed. Part of the LEDs can be turned off in this driving technique, so that power consumption can be reduced particularly in the case of displaying an image in which a black display region occupies a large area in one screen.

By combining these driving techniques, display characteristics such as moving image characteristics of the liquid crystal display device can be improved as compared to those of a conventional liquid crystal display device.

Next, a structure of the display device in this embodiment, which includes the above pixel, is described with reference to FIGS. 15B and 15C. FIGS. 15B and 15C illustrate a structure of the pixel in the display device in this embodiment. FIG. 15B is a top diagram of the pixel, and FIG. 15C is a cross-sectional diagram taken along line A1-A2 and line B1-B2 of FIG. 15B.

The liquid crystal display device illustrated in FIGS. 15B and 15C includes, in the cross section A1-A2, a conductive layer 2001 provided over a substrate 2000; an insulating layer 2002 provided over the conductive layer 2001; an oxide semiconductor layer 2003 provided over the insulating layer 2002; a pair of conductive layers 2005a and 2005b provided over the oxide semiconductor layer 2003; an oxide insulating layer 2007 provided over the conductive layers 2005a and 2005b and the oxide semiconductor layer 2003; and a transparent conductive layer 2020 which is in contact with the conductive layer 2005b through an opening provided in the oxide insulating layer 2007.

Note that the conductive layer 2001 serves as a gate terminal, the insulating layer 2002 serves as a gate insulating layer, one of the conductive layers 2005a and 2005b serves as a first terminal, and the other of the conductive layers 2005a and 2005b serves as a second terminal. Although the transistor described in Embodiment 2 (see FIG. 8B) is employed here, the transistor described in Embodiment 3 or 4 can be employed as the transistor.

The liquid crystal display device illustrated in FIGS. 15B and 15C includes, in the cross section B1-B2, a conductive layer 2008 provided over the substrate 2000; the insulating layer 2002 provided over the conductive layer 2008; the oxide insulating layer 2007 provided over the insulating layer 2002; and the transparent conductive layer 2020 provided over the oxide insulating layer 2007.

Further, the liquid crystal display device in this embodiment includes a conductive layer 2022 and a transparent conductive layer 2029, a conductive layer 2023, a conductive layer 2024, and a transparent conductive layer 2028 which serve as an electrode or a wiring for connecting flexible printed circuits (FPC).

The transparent conductive layers 2020, 2029, and 2028 are formed using indium oxide ($In_2O_3$), an alloy of indium oxide and tin oxide ($In_2O_3$—$SnO_2$, referred to as ITO), or the like by a sputtering method, a vacuum evaporation method, or the like. Such a material is etched with a hydrochloric acid-based solution. Note that since etching of ITO particularly tends to leave residue, an alloy of indium oxide and zinc oxide ($In_2O_3$—$ZnO$) may be used in order to improve the etching processability.

Note that this embodiment or part of this embodiment can be freely combined with the other embodiments or part of the other embodiments.

Embodiment 7

In this embodiment, as an example of the display device described in Embodiment 5, a light-emitting display device including a light-emitting element utilizing electroluminescence is described with reference to FIGS. 16A and 16B and FIGS. 17A and 17B.

Light-emitting elements utilizing electroluminescence are classified according to whether a light-emitting material is an organic compound or an inorganic compound. In general, the former is referred to as an organic EL element, and the latter as an inorganic EL element.

In an organic EL element, by application of voltage to the light-emitting element, electrons and holes are separately injected from a pair of electrodes into a layer containing a light-emitting organic compound, and there flows a current. Then, the carriers (electrons and holes) are recombined, thereby emitting light. Based on such a mechanism, such a light-emitting element is referred to as a current-excitation light-emitting element.

Inorganic EL elements are classified, according to the element structures, into a dispersion inorganic EL elements and thin-film inorganic EL elements. A dispersion inorganic EL element includes a light-emitting layer where particles of a light-emitting material are dispersed in a binder, and its light emission mechanism is donor-acceptor recombination light emission utilizing a donor level and an acceptor level. A thin-film inorganic EL element has a structure in which a light-emitting layer is sandwiched between dielectric layers, which are further sandwiched between electrodes, and its light emission mechanism is localized light emission utilizing inner-shell electron transition of metal ions. Note that, an organic EL element is described as a light-emitting element here.

Figure 16A:
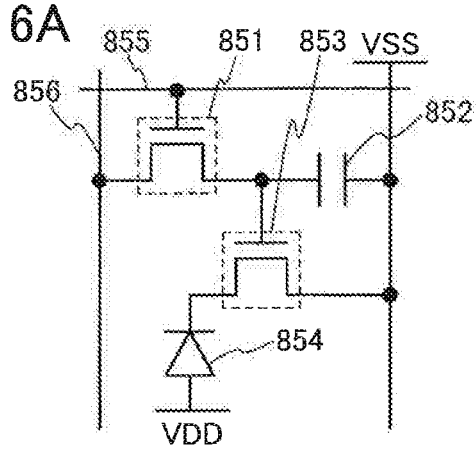
FIG. 16A is a circuit diagram and FIGS. 16B to 16D are cross-sectional diagrams, of a pixel of a light-emitting display device described in Embodiment 7.

FIG. 16A is a circuit diagram illustrating a circuit configuration of a pixel in the light-emitting display device in this embodiment.

As illustrated in FIG. 16A, the pixel of the display device in this embodiment includes a transistor 851, a capacitor 852 serving as a storage capacitor in the pixel, a transistor 853, and a light-emitting element 854.

A gate terminal of the transistor 851 is electrically connected to a scan line 855. A first terminal of the transistor 851 is electrically connected to a signal line 856.

One terminal of the capacitor 852 is electrically connected to a second terminal of the transistor 851. The other terminal of the capacitor 852 is electrically connected to the low power supply potential line.

A gate terminal of the transistor 853 is electrically connected to the second terminal of the transistor 851 and the one terminal of the capacitor 852. A first terminal of the transistor 853 is electrically connected to the low power supply potential line.

A first terminal of the light-emitting element 854 is electrically connected to a second terminal of the transistor 853. A second terminal of the light-emitting element 854 is electrically connected to the high power supply potential line.

When a signal is inputted to a pixel, first, a pixel to which data is written is selected. In the selected pixel, the transistor 851 is turned on by a scan signal inputted from the scan line 855, and a video signal (also referred to as a data signal) which is a fixed voltage is inputted from the signal line 856 to the gate terminal of the transistor 853.

The transistor 853 is turned on or off by a potential in response to the data signal inputted to the gate terminal. At this time, current flows depending on the voltage applied between one terminal and the other terminal of the light-emitting element 854, and the light-emitting element 854 emits light with luminance in response to the amount of current flowing therethrough. Further, the gate voltage of the transistor 853 is held for a certain period of time by the capacitor 852; thus, the light-emitting element 854 maintains a light-emitting state for a certain period of time.

When the data signal inputted from the signal line 856 to the pixel is digital, the light-emitting state of the pixel is controlled by switching on and off of the transistor. Accordingly, gradation can be expressed by an area ratio grayscale method or a time ratio grayscale method. An area ratio grayscale method refers to a driving method by which one pixel is divided into a plurality of subpixels and each of the subpixels with the structure illustrated in FIG. 16A is independently driven based on a data signal so that gradation is expressed. Further, a time ratio grayscale method refers to a driving method by which a period during which a pixel is in a light-emitting state is controlled so that gradation is expressed.

Since the response speed of light-emitting elements is higher than that of liquid crystal elements or the like, the light-emitting elements are suitable for a time ratio grayscale method as compared to the liquid crystal elements. Specifically, when display is performed by a time gray scale method, one frame period is divided into a plurality of subframe periods. Then, in accordance with video signals, the light-emitting state of the light-emitting element is controlled in each subframe period.

By dividing one frame period into a plurality of subframe periods, the total length of a period in which pixels actually emit light in one frame period can be controlled with video signals, and gradation can be expressed.

Next, a structure of a light-emitting element is described with reference to FIGS. 16B to 16D. Here, a cross-sectional structure of a pixel in the case where the transistor 853 is an n-channel transistor is described as an example. Note that the transistor 853 used in a light-emitting display device illustrated in FIGS. 16B to 16D is a driving transistor.

In order to extract light emitted from the light-emitting element 854, at least one of an anode and a cathode needs to be transparent. A transistor and a light-emitting element are formed over a substrate. There are light-emitting elements having a top emission structure in which light is extracted through the surface opposite to the substrate, having a bottom emission structure in which light is extracted through the surface on the substrate side, and having a dual emission structure in which light is extracted through the surface on the substrate side and the surface opposite to the substrate. The pixel structure of the present invention can be applied to a light-emitting element having any of these emission structures.

A light-emitting element having a top emission structure is described with reference to FIG. 16B.

Figure 16B:
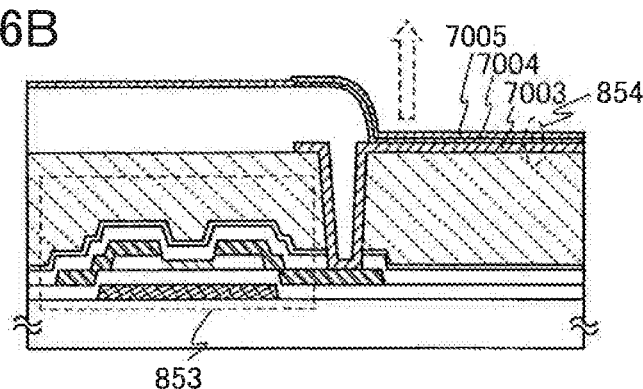
Figure 16C:
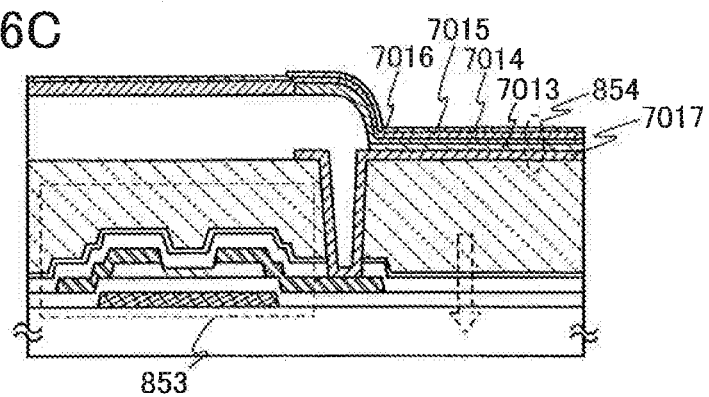
Figure 16D:
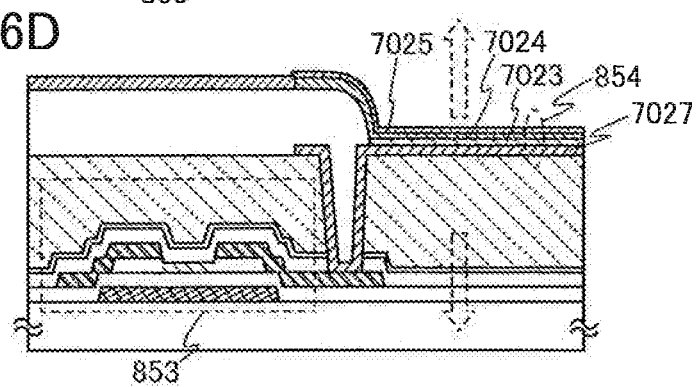

FIG. 16B is a cross-sectional diagram of a pixel in the case where the transistor 853, which is a driving transistor, is an n-channel transistor and light emitted from the light-emitting element 854 passes through an anode 7005. In FIG. 16B, a cathode 7003 of the light-emitting element 854 and the transistor 853, which is the driving transistor, are electrically connected to each other, and a light-emitting layer 7004 and the anode 7005 are sequentially stacked over the cathode 7003. As the cathode 7003, any conductive film can be used as long as it has a low work function and reflects light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer sequentially over the cathode 7003. Note that it is not necessary to form all of these layers. The anode 7005 is formed using a light-transmitting conductive material such as a material of indium oxide containing tungsten oxide, indium zinc oxide containing tungsten oxide, indium oxide containing titanium oxide, indium tin oxide containing titanium oxide, indium tin oxide (hereinafter also referred to as ITO), indium zinc oxide, or indium tin oxide to which silicon oxide is added.

The light-emitting element 854 corresponds to a region where the light-emitting layer 7004 is sandwiched between the cathode 7003 and the anode 7005. In the pixel illustrated in FIG. 16B, light is emitted from the light-emitting element 854 to the anode 7005 side as shown by an arrow.

Next, a light-emitting element having a bottom emission structure is described with reference to FIG. 16C. FIG. 16C is a cross-sectional diagram of a pixel in the case where the transistor 853 is an n-channel transistor and light is emitted from the light-emitting element 854 to a cathode 7013 side. In FIG. 16C, the cathode 7013 of the light-emitting element 854 is formed over a light-transmitting conductive layer 7017 which is electrically connected to the transistor 853, and a light-emitting layer 7014 and an anode 7015 are sequentially stacked over the cathode 7013. Note that when the anode 7015 has a light-transmitting property, a light-blocking layer 7016 for reflecting or blocking light may be formed so as to cover the anode 7015. As in the case of FIG. 16B, a variety of materials can be used for the cathode 7013 as long as a material is a conductive material having a low work function. Note that the cathode 7013 has a thickness that can transmit light (preferably has approximately 5 nm to 30 nm). For example, a 20-nm-thick aluminum layer can be used as the cathode 7013. The light-emitting layer 7014 may be formed using a single layer or by stacking a plurality of layers as in FIG. 16B. The anode 7015 is not necessary to transmit light, but can be formed using a light-transmitting conductive material as in FIG. 16B. The light-blocking layer 7016 can be formed using, for example, metal or the like which reflects light; however, one embodiment of the present invention is not limited to metal. For example, a resin to which a black pigment is added can be used.

The light-emitting element 854 corresponds to a region where the light-emitting layer 7014 is sandwiched between the cathode 7013 and the anode 7015. In the pixel illustrated in FIG. 16C, light is emitted from the light-emitting element 854 to the cathode 7013 side as shown by an arrow.

Next, a light-emitting element having a dual emission structure is described with reference to FIG. 16D. In FIG. 16D, a cathode 7023 of the light-emitting element 854 is formed over a light-transmitting conductive layer 7027 which is electrically connected to the transistor 853, and a light-emitting layer 7024 and an anode 7025 are sequentially stacked over the cathode 7023. As in the case of FIG. 16B, a variety of materials can be used for the cathode 7023 as long as a material is a conductive material having a low work function. Note that the cathode 7023 has a thickness that can transmit light. For example, a 20-nm-thick aluminum layer can be used as the cathode 7023. The light-emitting layer 7024 may be formed using a single layer or by stacking a plurality of layers as in FIG. 16B. The anode 7025 can be formed using a light-transmitting conductive material as in FIG. 16B.

The light-emitting element 854 corresponds to a region where the cathode 7023, the light-emitting layer 7024, and the anode 7025 overlap with each other. In the pixel illustrated in FIG. 16D, light is emitted from the light-emitting element 854 to both the anode 7025 side and the cathode 7023 side as shown by arrows.

Note that, although the organic EL elements are described here as the light-emitting elements, an inorganic EL element can also be provided as a light-emitting element.

Note that in this embodiment, the example is described in which a transistor (also referred to as a driving transistor) which controls driving of a light-emitting element is electrically connected to the light-emitting element; alternatively, a structure may be employed in which a transistor for current control is connected between the driving transistor and the light-emitting element.

Figure 17A:
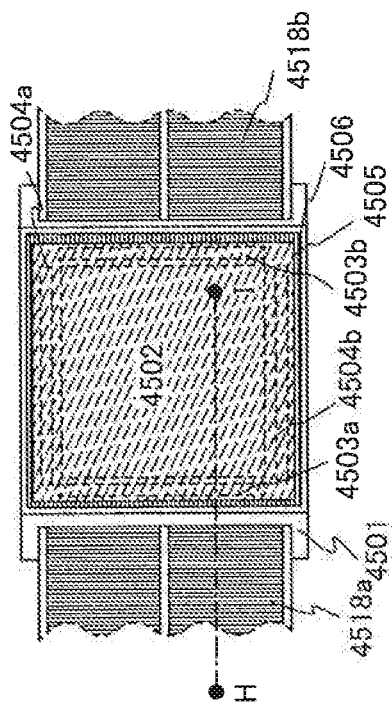
FIGS. 17A and 17B are a top diagram and a cross-sectional diagram, respectively, of a light-emitting display device described in Embodiment 7.
Figure 17B:
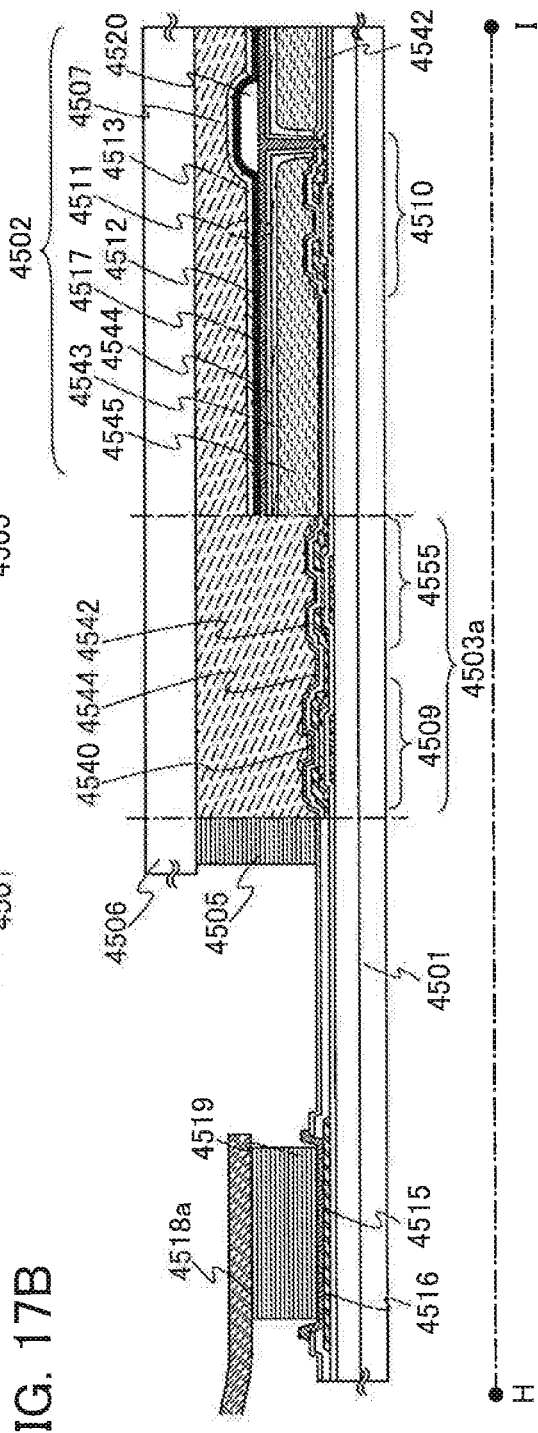

Next, the appearance and cross section of the light-emitting display device (also referred to as a light-emitting panel) in this embodiment are described with reference to FIGS. 17A and 17B. FIG. 17A is a top diagram of the light-emitting display device, in which a transistor and a light-emitting element formed over a first substrate are sealed between the first substrate and a second substrate by a sealing material. FIG. 17B is a cross-sectional diagram taken along line H-I of FIG. 17A.

A sealing material 4505 is provided so as to surround a pixel portion 4502, a signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed, together with a filler 4507, by the first substrate 4501, the sealing material 4505, and the second substrate 4506. In such a manner, it is preferable to pack (seal) the pixel portion 4502, the signal line driver circuits 4503a and 4503b, and the scan line driver circuits 4504a and 4504b with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the air.

The pixel portion 4502, the signal line driver circuits 4503a and 4503b, and the scan line driver circuits 4504a and 4504b, which are formed over the first substrate 4501, each include a plurality of transistors. In FIG. 17B, a transistor 4510 included in the pixel portion 4502 and transistors 4509 and 4555 included in the signal line driver circuit 4503a are illustrated as an example.

As the transistors 4509, 4510, and 4555, any of the highly reliable transistors described in Embodiments 2 to 4 which include an oxide semiconductor layer as a semiconductor layer, can be used. In this embodiment, the transistors 4509, 4510, and 4555 are n-channel transistors. An insulating layer 4542 is formed over the transistors 4509, 4510, and 4555. An insulating layer 4544 is formed over the insulating layer 4542. A conductive layer 4540 is formed over the transistor 4509 with the insulating layers 4542 and 4544 provided therebetween. The conductive layer 4540 has a function of a second gate terminal.

Note that in the pixel portion 4502, a planarization insulating layer 4545 is provided over the insulating layer 4542, and an insulating layer 4543 is provided over the planarization insulating layer 4545.

Moreover, reference numeral 4511 denotes a light-emitting element. A first electrode 4517 which is a pixel electrode included in the light-emitting element 4511 is electrically connected to a second terminal of the transistor 4510. Note that the light-emitting element 4511 has a stacked structure of the first electrode 4517, a light-emitting layer 4512, and a second electrode 4513; however, the structure of the light-emitting element is not limited to that shown in this embodiment. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. In particular, it is preferable that the bank 4520 be formed using a photosensitive material to have an opening portion over the first electrode 4517, and a sidewall of the opening portion be formed as an inclined surface with a continuous curvature.

The light-emitting layer 4512 may be formed using a single layer or a stack of a plurality of layers.

In order to prevent oxygen, hydrogen, moisture, carbon dioxide, or the like from entering the light-emitting element 4511, a protective layer may be formed over the second electrode 4513 and the bank 4520. As the protective layer, a silicon nitride layer, a silicon nitride oxide layer, a DLC (diamond like carbon) layer, or the like can be formed.

Further, a variety of signals and voltages are supplied to the signal line driver circuits 4503a and 4503b, the scan line driver circuits 4504a and 4504b, or the pixel portion 4502 from FPCs 4518a and 4518b.

In the light-emitting display device illustrated in FIGS. 17A and 17B, a connection terminal electrode 4515 is formed using the same conductive film as the conductive film for forming the first electrode 4517 included in the light-emitting element 4511. A terminal electrode 4516 is formed using the same conductive film as the conductive film for forming the source electrodes and the drain electrodes of the transistors 4509, 4510, and 4555.

The connection terminal electrode 4515 is electrically connected to a terminal of the FPC 4518a through an anisotropic conductive layer 4519.

The substrate located in the direction in which light is extracted from the light-emitting element 4511 needs to have a light-transmitting property. In that case, a light-transmitting material such as a glass, a plastic, a polyester film, or an acrylic film is used as the substrate.

As the filler 4507, an ultraviolet curable resin or a thermosetting resin can be used other than an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

If necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. Further, a polarizing plate or a circularly polarizing plate may be provided with an anti-reflection film.

As the signal line driver circuits 4503a and 4503b and the scan line driver circuits 4504a and 4504b, a driver circuit formed using a single crystal semiconductor layer or a polycrystalline semiconductor layer may be mounted on a substrate separately prepared. Alternatively, only the signal line driver circuits 4503a and 4503b or part thereof, or the scan line driver circuits 4504a and 4504b, or part thereof may be separately formed to be mounted. This embodiment is not limited to the structure in FIGS. 17A and 17B.

Through the above steps, a light-emitting display device (display panel) can be manufactured.

Note that this embodiment or part of this embodiment can be freely combined with the other embodiments or part of the other embodiments.

Embodiment 8

In this embodiment, as an example of the display device described in Embodiment 5, electronic paper which can display images without an external connection line such as an FPC is described with reference to FIGS. 18A to 18C and FIG. 19.

Note that the electronic paper in this embodiment has a period for holding an image (an image holding period) and a period for rewriting an image (an image rewriting period). In the image holding period, electronic power for holding the image is not needed. Accordingly, the electronic paper is a display device with less power consumption.

The electronic paper includes a display element; display can be controlled by application of voltage to the display element and can be maintained in a state where voltage is not applied to the display element. Examples of the display element include an element using electrophoresis (an electrophoretic element), a particle rotation type element using a twisting ball, a particle transfer type element using a charged toner or Electronic Liquid Powder (registered trademark), a magnetophoretic element in which gradation is expressed by magnetism, a liquid transfer type element, a light-scattering element, and a phase-change element. In this embodiment, electronic paper including an electrophoretic element is described as an example of electronic paper.

An example of the electrophoretic elements is an element having a microcapsule containing positively charged first particles, negatively charged second particles which exhibit color different from that of the first particles, and liquid serving as a solvent. By application of voltage to the electrophoretic element, the first particles or the second particles are collected on one side of the microcapsule; thus, display can be performed. Note that in a state where voltage is not applied to the electrophoretic element, the first particles and the second particles are not transferred. That is, the display of the electrophoretic element is maintained. Alternatively, as the electrophoretic element, an element having a microcapsule containing positively or negatively charged particles and liquid which exhibits color different from that of the particles and serves as a solvent can be used, for example.

Note that for the positively or negatively charged particles in the microcapsule, one or a composite material of a conductive material, an insulating material, a semiconductor material, a magnetic material, a liquid crystal material, a ferroelectric material, an electroluminescent material, an electrochromic material, or a magnetophoretic material may be used.

Next, an example of a structure of the electronic paper in this embodiment is described with reference to FIGS. 18A to 18C. Note that FIG. 18A is a circuit diagram of a pixel of the electronic paper, FIG. 18B is a top diagram of the pixel, and FIG. 18C is a cross-sectional diagram taken along line A-B of FIG. 18B.

Figure 18A:
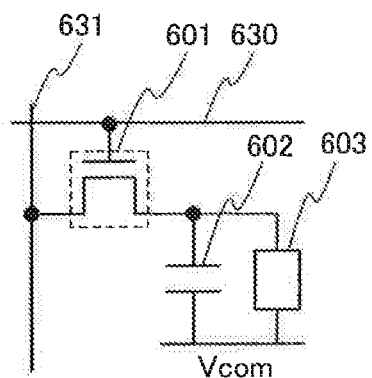
FIGS. 18A to 18C are a circuit diagram, a top diagram, and a cross-sectional diagram, respectively, of a pixel of electronic paper described in Embodiment 7.

The pixel of the electronic paper in this embodiment includes a transistor 601, a capacitor 602, and an electrophoretic element 603 (see FIG. 18A). A gate terminal of the transistor 601 is electrically connected to a scan line 630. A first terminal of the transistor 601 is electrically connected to a signal line 631. One terminal of the capacitor 602 is electrically connected to a second terminal of the transistor 601. The other terminal of the capacitor 602 is electrically connected to a common potential line. One terminal of the electrophoretic element 603 is electrically connected to the second terminal of the transistor 601 and one terminal of the capacitor 602. The other terminal of the electrophoretic element 603 is electrically connected to the common potential line. Note that in this embodiment, a ground potential, 0V, or the like is given as a common potential ($V_{com}$).

Figure 18B:
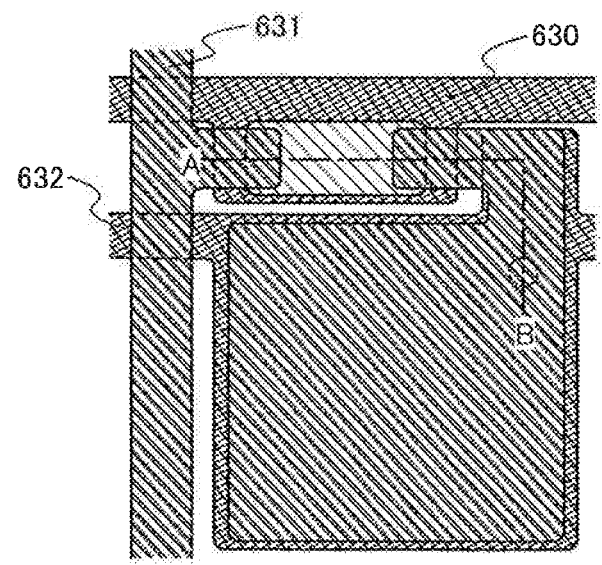
Figure 18C:
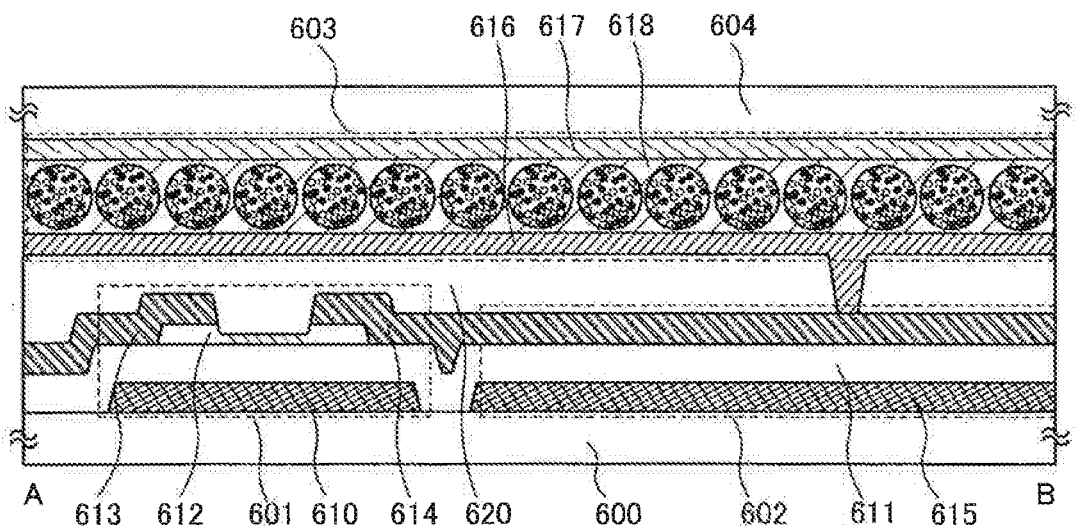

The pixel includes a substrate 600, the transistor 601 and the capacitor 602 which are provided over the substrate 600, the electrophoretic element 603 provided over the transistor 601 and the capacitor 602, and a substrate 604 provided over the electrophoretic element 603 (see FIGS. 18B and 18C). Note that the electrophoretic element 603 is not illustrated in FIG. 18B.

The transistor 601 includes a conductive layer 610 which is electrically connected to the scan line 630, an insulating layer 611 over the conductive layer 610, a semiconductor layer 612 over the insulating layer 611, and conductive layers 613 and 614 which are electrically connected to the signal line 631 over the semiconductor layer 612. Note that the conductive layer 610 serves as a gate terminal, the insulating layer 611 serves as a gate insulating layer, the conductive layer 613 serves as a first terminal, and the conductive layer 614 serves as a second terminal. Further, the conductive layer 610 and the conductive layer 613 can be expressed as part of the scan line 630 and part of the signal line 631, respectively.

The capacitor 602 includes the conductive layer 614, the insulating layer 611, and a conductive layer 615 which is electrically connected to a common potential line 632. Note that the conductive layer 614 serves as one terminal, the insulating layer 611 serves as a dielectric, and the conductive layer 615 serves as the other terminal. The conductive layer 615 can be expressed as part of the common potential line 632.

The electrophoretic element 603 includes a pixel electrode 616 which is electrically connected to the conductive layer 614 in an opening portion provided in an insulating layer 620, a counter electrode 617 to which the same potential as that of the conductive layer 615 is applied, and a layer 618 which includes charged particles and is provided between the pixel electrode 616 and the counter electrode 617. Note that the pixel electrode 616 serves as one terminal and the counter electrode 617 serves as the other terminal.

In the electronic paper in this embodiment, voltage applied to the layer 618 including the charged particles is controlled; thus, transfer of the charged particles which are dispersed in the layer 618 can be controlled. The counter electrode 617 and the substrate 604 of the electronic paper in this embodiment have a light-transmitting property. That is, the display device in this embodiment is a reflective display device in which the substrate 604 side corresponds to a display surface.

Materials which can be used for components of the electronic paper in this embodiment are given below.

Examples of the substrate 600 include a semiconductor substrate (e.g., a single crystal substrate or a silicon substrate), an SOI substrate, a glass substrate, a quartz substrate, a conductive substrate whose top surface is provided with an insulating layer, flexible substrates such as a plastic substrate, a bonding film, paper containing a fibrous material, and a base film. As examples of the glass substrate, there are a barium borosilicate glass substrate, an aluminoborosilicate glass substrate, and a soda lime glass substrate. As examples of the flexible substrate, there are flexible synthetic resins such as plastics typified by polyethylene terephthalate (PET), polyethylene naphthalate (PEN), polyether sulfone (PES), and acrylic.

As the conductive layers 610 and 615, the scan line 630, and the common potential line 632, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

As the insulating layer 611, an insulator such as silicon oxide, silicon nitride, silicon oxynitride, silicon nitride oxide, aluminum oxide, or tantalum oxide can be employed. A stacked structure of these materials can also be used. Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, silicon nitride oxide refers to a substance which contains more nitrogen than oxygen and contains oxygen, nitrogen, silicon, and hydrogen at given concentrations ranging from 15 atomic % to 30 atomic %, 20 atomic % to 35 atomic %, 25 atomic % to 35 atomic %, and 15 atomic % to 25 atomic %, respectively, where the total percentage of atoms is 100 atomic %.

The semiconductor layer 612 can be formed using any of the following semiconductor material, for example: a material containing an element belonging to Group 14 of the periodic table, such as silicon (Si) or germanium (Ge), as its main component; a compound such as silicon germanium (SiGe) or gallium arsenide (GaAs); oxide such as zinc oxide (ZnO) or zinc oxide containing indium (In) and gallium (Ga); or an organic compound exhibiting semiconductor characteristics can be used. A stacked structure of layers formed using these semiconductor materials can also be used.

As the conductive layers 613 and 614, and the signal line 631, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

As the insulating layer 620, an insulator such as silicon oxide, silicon oxynitride, silicon nitride, silicon nitride oxide, aluminum oxide, or tantalum oxide can be used. Further, the insulating layer 620 can also be formed using an organic material such as polyimide, polyamide, polyvinylphenol, benzocyclobutene, acrylic, or epoxy; a siloxane material such as a siloxane resin; an oxazole resin; or the like. Note that a siloxane material corresponds to a material having a Si—O—Si bond. Siloxane has a skeleton structure with a bond of silicon (Si) and oxygen (O). As a substituent, an organic group (e.g., an alkyl group or aromatic hydrocarbon) or a fluoro group may be used. The organic group may include a fluoro group.

As the pixel electrode 616, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used. Further, a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

As the charged particles contained in the layer 618 including charged particles, titanium oxide or the like can be used as positively charged particles, and carbon black or the like can be used as negatively charged particles. In addition, a single material selected from a conductive material, an insulating material, a semiconductor material, a magnetic material, a liquid crystal material, a ferroelectric material, an electroluminescent material, an electrochromic material, or a magnetophoretic material, or a composite material formed using any of these materials can also be used.

As the counter electrode 617, a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

As the substrate 604, a light-transmitting substrate can be used. The light-transmitting substrate is typified by a glass substrate formed using barium borosilicate glass, aluminoborosilicate glass, soda-lime glass, or the like; or a flexible substrate formed using polyethylene terephthalate (PET) or the like.

Figure 19:
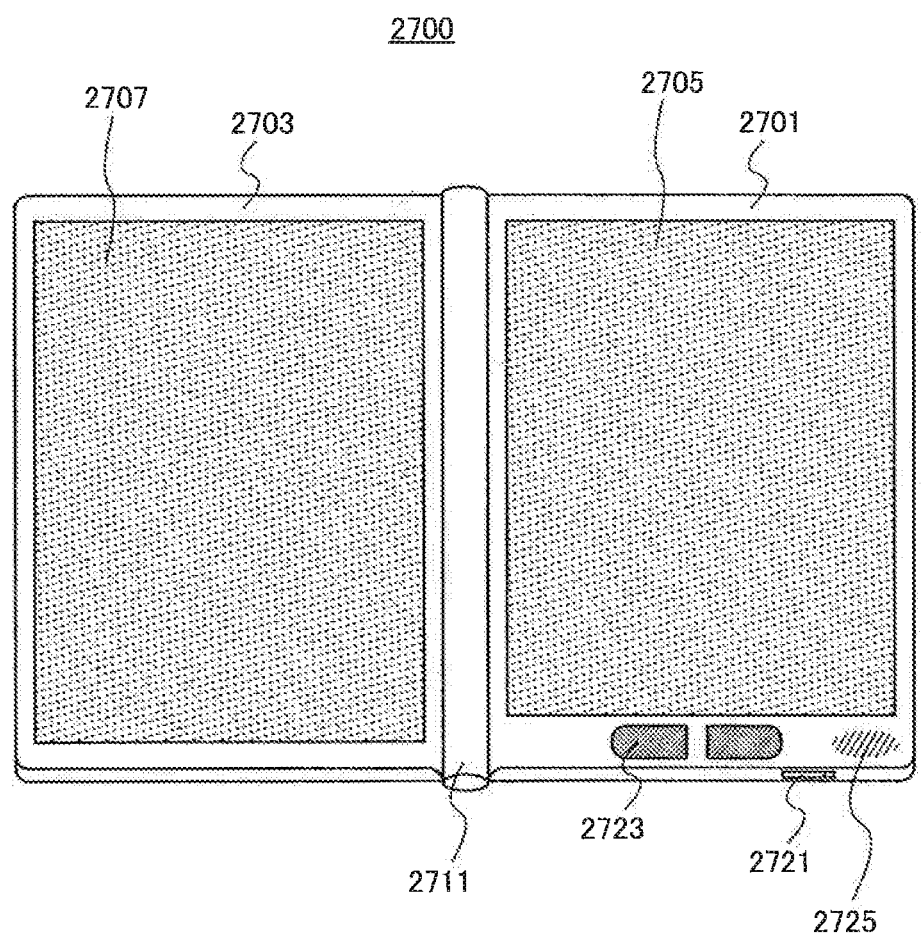
FIG. 19 is a diagram illustrating an example of an electronic book described in Embodiment 8.

The electronic paper in this embodiment can be used in electronic appliances of various fields, which display information. For example, the electronic paper can be applied to e-book readers (electronic books), posters, advertisements on vehicles such as trains, or displays on a variety of cards such as credit cards. An example of such an electronic appliance is illustrated in FIG. 19. FIG. 19 illustrates an example of an e-book reader.

As illustrated in FIG. 19, an e-book reader 2700 has two housings 2701 and 2703. The housings 2701 and 2703 are united with an axis portion 2711, and the e-book reader 2700 can be opened and closed with the axis portion 2711 as an axis. With such a structure, the e-book reader 2700 can be operated like a paper book.

A display portion 2705 is incorporated into the housing 2701. A display portion 2707 is incorporated into the housing 2703. The display portions 2705 and 2707 may display one image or different images. When the display portions display different images, text can be displayed on the right display portion (the display portion 2705 in FIG. 19) and an image can be displayed on the left display portion (the display portion 2707 in FIG. 19), for example.

Further, FIG. 19 illustrates an example where the housing 2701 is provided with an operation portion and the like. For example, the housing 2701 is provided with a power supply switch 2721, operation keys 2723, a speaker 2725, and the like. Pages can be turned by the operation key 2723. Note that a keyboard, a pointing device, or the like may be provided on the same side as the display portion in the housing. Moreover, a terminal for external connection (e.g., an earphone terminal, a USB terminal, and a terminal capable of connecting a variety of cables such as an AC adapter and a USB cable), a portion for inserting recording media, or the like may be provided on a rear surface or a side surface of the housing. Furthermore, the e-book reader 2700 may functions as an electronic dictionary.

In addition, the e-book reader 2700 may wirelessly transmit and receive information. The e-book reader 2700 can have a structure where desired book data or the like is wirelessly purchased and downloaded from an e-book server.

Note that this embodiment or part of this embodiment can be freely combined with the other embodiments or part of the other embodiments.

Embodiment 9

The display devices described in Embodiments 5 to 8 can be applied to a variety of electronic appliances (including amusement machines). Examples of electronic appliances are television devices (also referred to as televisions or television receivers), monitors for computers and the like, cameras such as digital cameras and digital video cameras, digital photo frames, mobile phone devices (also referred to as mobile phones or cellular phones), portable game machines, portable information terminals, sound reproducing devices, and large game machines such as pachinko machines.

Figure 20A:
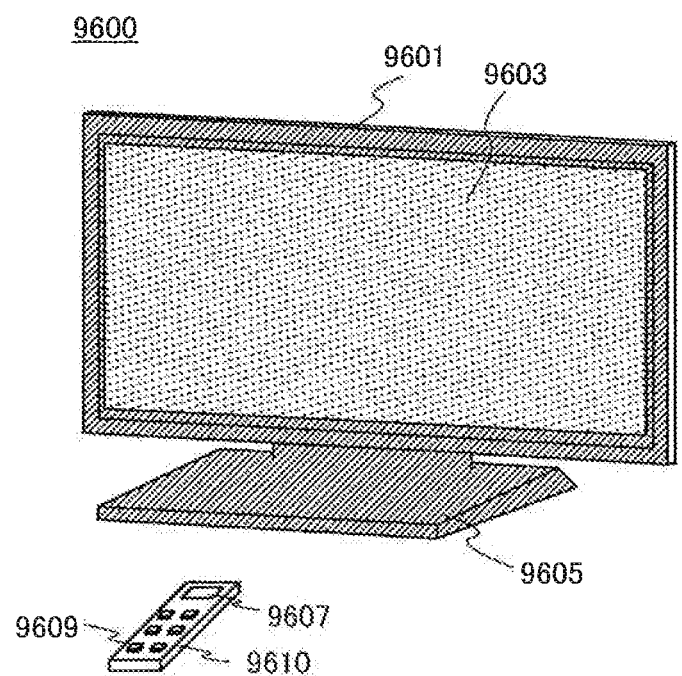
FIGS. 20A and 20B are diagrams each illustrating an example of an electronic appliance described in Embodiment 9.

FIG. 20A illustrates an example of a television device. In a television device 9600, a display portion 9603 is incorporated into a housing 9601. The display portion 9603 can display an image. Further, the housing 9601 is supported by a stand 9605 here.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television device 9600 is provided with a receiver, a modem, and the like. With the receiver, general television broadcast can be received. Further, when the television device 9600 is connected to a communication network by wired or wireless connection via the modem, one-way (from a transmitter to a receiver) or two-way (between a transmitter and a receiver or between receivers) data communication can be performed.

Figure 20B:
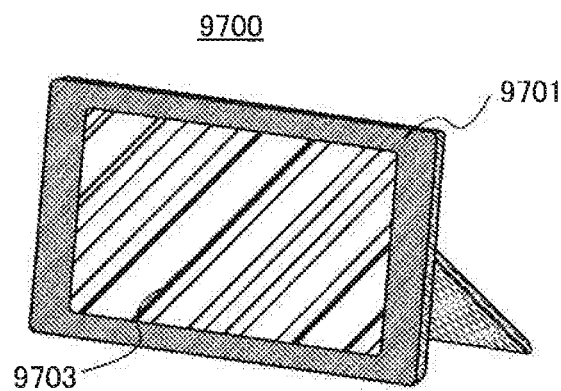

FIG. 20B illustrates an example of a digital photo frame. For example, in a digital photo frame 9700, a display portion 9703 is incorporated into a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (e.g., a USB terminal, or a terminal which can be connected to various cables such as a USB cable), a recording medium insertion portion, and the like. Although these components may be provided on the surface on which the display portion is provided, it is preferable to provide them on the side surface or the rear surface for the design of the digital photo frame 9700. For example, a memory storing data of an image taken with a digital camera is inserted in the recording medium insertion portion of the digital photo frame, and the image data can be transferred and then displayed on the display portion 9703.

Further, the digital photo frame 9700 may be configured to transmit and receive data wirelessly. The structure may be employed in which desired image data is transferred wirelessly to be displayed.

Figure 21A:
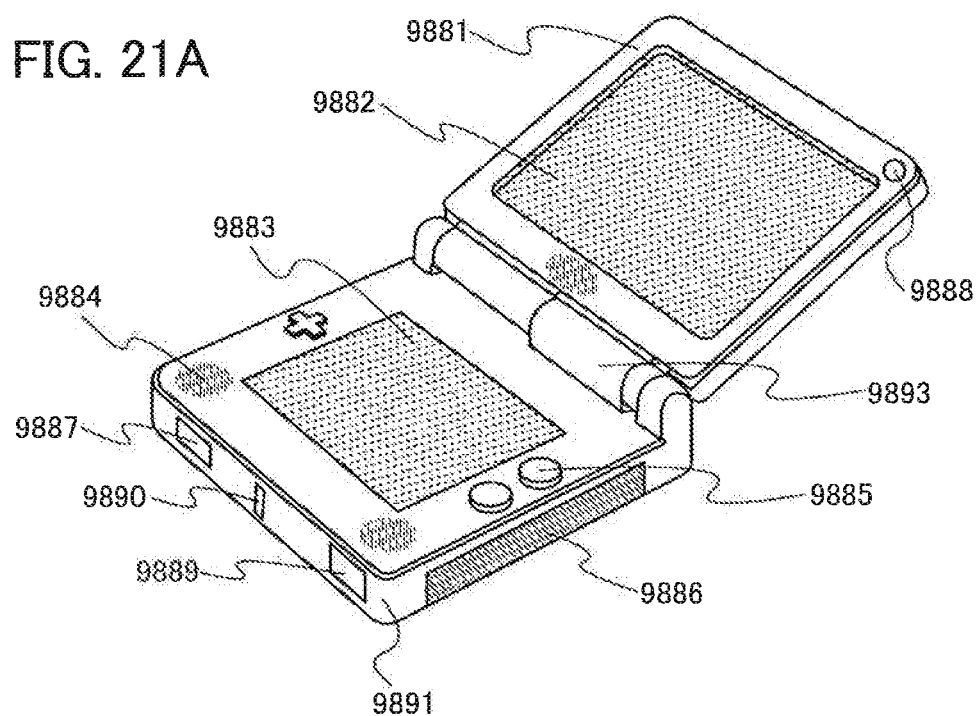
FIGS. 21A and 21B are diagrams each illustrating an example of an electronic appliance described in Embodiment 9.

FIG. 21A is a portable game machine and includes two housings of a housing 9881 and a housing 9891, which are connected with a joint portion 9893 so that the portable game machine can be opened and folded. A display portion 9882 is incorporated into the housing 9881, and a display portion 9883 is incorporated into the housing 9891. Moreover, the portable game machine illustrated in FIG. 21A is provided with a speaker 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine may have a structure in which additional accessory equipment is provided as appropriate as long as at least a display device is provided. The portable game machine in FIG. 21A has a function of reading a program or data stored in a recording medium to display it on the display portion, and a function of sharing information with another portable game machine by wireless communication. Note that a function of the portable game machine in FIG. 21A is not limited to those described above, and the portable game machine can have a variety of functions.

Figure 21B:
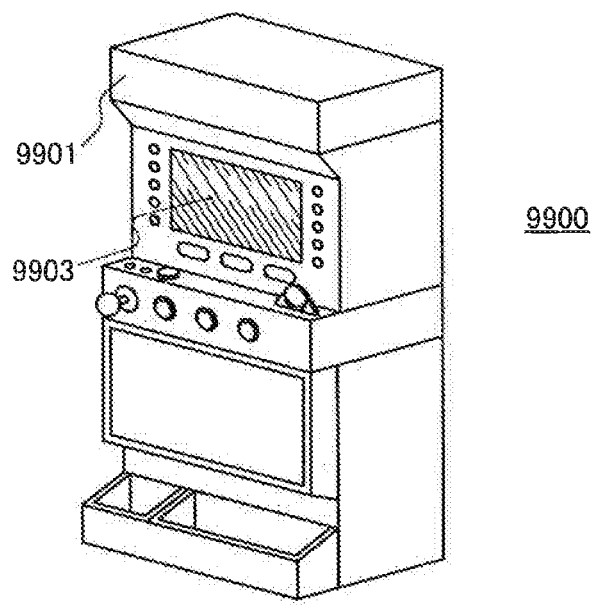

FIG. 21B illustrates an example of a slot machine, which is a large amusement machine. In a slot machine 9900, a display portion 9903 is incorporated into a housing 9901. Moreover, the slot machine 9900 is provided with operation means such as a start lever and a stop switch, a coin slot, a speaker, and the like. Needless to say, the structure of the slot machine 9900 is not limited to the above structure. The slot machine may have a structure in which additional accessory equipment is provided as appropriate as long as at least the display device described in any of the above embodiments is provided.

Figure 22A:
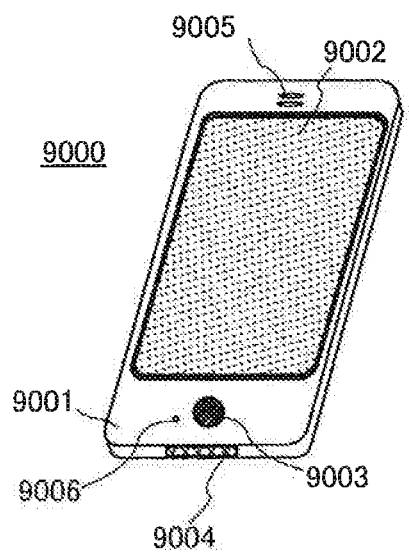
FIGS. 22A and 22B are diagrams each illustrating an example of an electronic appliance described in Embodiment 9.

FIG. 22A illustrates an example of a mobile phone. A mobile phone 9000 is provided with a display portion 9002 incorporated into a housing 9001, an operation button 9003, an external connection port 9004, a speaker 9005, a microphone 9006, and the like.

When the display portion 9002 of the mobile phone 9000 illustrated in FIG. 22A is touched with a finger or the like, data can be inputted into the mobile phone 9000. Further, operation such as making calls and texting can be performed by touching the display portion 9002 with a finger or the like.

There are mainly three screen modes of the display portion 9002. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, a text input mode mainly for inputting text is selected for the display portion 9002 so that characters displayed on a screen can be inputted. In that case, it is preferable to display a keyboard or number buttons on almost all area of the screen of the display portion 9002.

When a detection device including a sensor for detecting inclination, such as a gyroscope or an acceleration sensor, is provided inside the mobile phone 9000, display on the screen of the display portion 9002 can be automatically changed by determining the orientation of the mobile phone 9000 (whether the mobile phone 9000 stands upright or is laid down on its side).

The screen modes are changed by touching the display portion 9002 or using the operation button 9003 of the housing 9001. Alternatively, the screen modes may be changed depending on the kind of the image displayed on the display portion 9002. For example, when a signal of an image displayed on the display portion 9002 is data of moving images, the screen mode is changed to the display mode. When the signal is text data, the screen mode is changed to the input mode.

Further, in the input mode, when input by touching the display portion 9002 is not performed for a certain period while a signal detected by an optical sensor in the display portion 9002 is detected, the screen mode may be controlled so as to be changed from the input mode to the display mode.

The display portion 9002 can also function as an image sensor. For example, an image of a palm print, a fingerprint, or the like is taken when the display portion 9002 is touched with a palm or a finger, whereby personal identification can be performed. Further, when a backlight or a sensing light source which emits near-infrared light is provided in the display portion, an image of a finger vein, a palm vein, or the like can be taken.

Figure 22B:
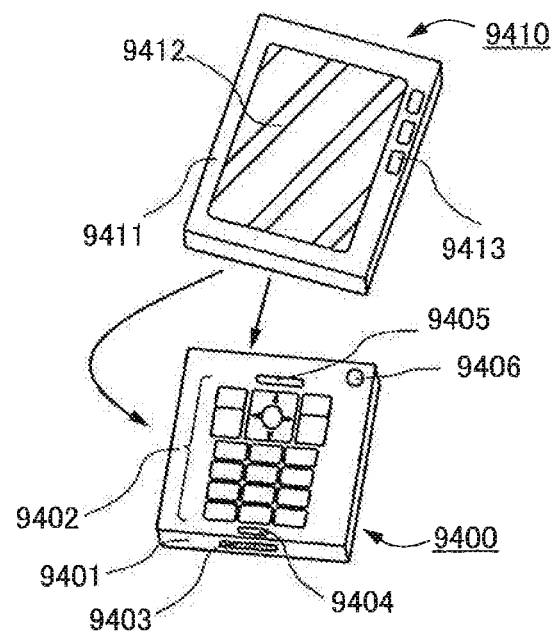

FIG. 22B illustrates another example of a mobile phone. The mobile phone in FIG. 22B includes a display device 9410 in a housing 9411, which includes a display portion 9412 and operation buttons 9413; and a communication device 9400 in a housing 9401, which includes scan buttons 9402, an external input terminal 9403, a microphone 9404, a speaker 9405, and a light-emitting portion 9406 that emits light when receiving a call. The display device 9410 having a display function can be detached from and attached to the communication device 9400 having a telephone function in two directions shown by arrows. Accordingly, short axes of the display device 9410 and the communication device 9400 can be attached to each other, or long axes of the display device 9410 and the communication device 9400 can be attached to each other. Further, when only a display function is necessary, the display device 9410 may be detached from the communication device 9400 so that the semiconductor device 9410 can be used by itself. The communication device 9400 and the display device 9410 can transmit and receive images or input information to/from each other by wireless communication or wired communication, and each of the communication device 9400 and the display device 9410 has a rechargeable battery.

Note that this embodiment or part of this embodiment can be freely combined with the other embodiments or part of the other embodiments.

This application is based on Japanese Patent Application serial no. 2009-234845 filed with Japan Patent Office on Oct. 9, 2009, the entire contents of which are hereby incorporated by reference.

EXPLANATION OF REFERENCE

101: transistor, 102: transistor, 103: transistor, 104: transistor, 105: transistor, 106: transistor, 111: clock signal selection transistor, transistor, 112: clock signal selection transistor, transistor, 113: clock signal selection transistor, 114: clock signal selection transistor, 115: clock signal selection transistor, 116: clock signal selection transistor, 121: low power supply potential selection transistor, 122: low power supply potential selection transistor, 123: low power supply potential selection transistor, 124: low power supply potential selection transistor, 125: low power supply potential selection transistor, 126: low power supply potential selection transistor, 131: transistor, 132: transistor, 133: transistor, 134: transistor, 201: substrate, 202: insulating layer, 207: oxide semiconductor layer, 211: conductive layer, 213: oxide semiconductor layer, 214a: oxide conductive layer, 214b: oxide conductive layer, 215a: conductive layer, 215b: conductive layer, 215c: conductive layer, 217: conductive layer, 233a: resist mask, 233b: resist mask, 251: transistor, 252: transistor, 600: substrate, 601: transistor, 602: capacitor, 603: electrophoretic element, 604: substrate, 610: conductive layer, 611: insulating layer, 612: semiconductor layer, 613: conductive layer, 614: conductive layer, 615: conductive layer, 616: pixel electrode, 617: counter electrode, 618: layer including charged particles, 620: insulating layer, 630: scan line, 631: signal line, 632: common potential line, 701: pixel portion, 702: scan line driver circuit, 703: signal line driver circuit, 704: pixel, 705: scan line, 706: signal line, 804: scan line, 805: signal line, 821: transistor, 822: liquid crystal element, 823: capacitor, 851: transistor, 852: capacitor, 853: transistor, 854: light-emitting element, 855: scan line, 856: signal line, 900: shift register, 901: level shifter, 902: buffer, 903: shift register, 904: latch circuit, 905: latch circuit, 906: level shifter, 907: buffer, 2000: substrate, 2001: conductive layer, 2002: insulating layer, 2003: oxide semiconductor layer, 2005a: conductive layer, 2005b: conductive layer, 2007: oxide semiconductor layer, 2008: conductive layer, 2020: transparent conductive layer, 2022: conductive layer, 2023: conductive layer, 2024: conductive layer, 2028: transparent conductive layer, 2029: transparent conductive layer, 2112: conductive layer, 2132: oxide semiconductor layer, 2142a: oxide conductive layer, 2142b: oxide conductive layer, 2700: e-book reader, 2701: housing, 2703: housing, 2705: display portion, 2707: display portion, 2711: axis portion, 2721: power supply switch, 2723: operation key, 2725: speaker, 4501: substrate, 4502: pixel portion, 4503a: signal line driver circuit, 4503b: signal line driver circuit, 4504a: scan line driver circuit, 4504b: scan line driver circuit, 4505: sealing material, 4506: substrate, 4507: filler, 4509: transistor, 4510: transistor, 4511: light-emitting element, 4512: light-emitting layer, 4513: electrode, 4515: connection terminal electrode, 4516: terminal electrode, 4517: electrode, 4518a: FPC, 4518b: FPC, 4519: anisotropic conductive layer, 4520: bank, 4540: conductive layer, 4542: insulating layer, 4543: insulating layer, 4544: insulating layer, 4545: planarization insulating layer, 4555: transistor, 7003: cathode, 7004: light-emitting layer, 7005: anode, 7013: cathode, 7014: light-emitting layer, 7015: anode, 7016: light-blocking layer, 7017: conductive layer, 7023: cathode, 7024: light-emitting layer, 7025: anode, 7027: conductive layer, 9000: mobile phone device, 9001: housing, 9002: display portion, 9003: operation button, 9004: external connection port, 9005: speaker, 9006: microphone, 9400: communication device, 9401: housing, 9402: operation button, 9403: external input terminal, 9404: microphone, 9405: speaker, 9406: light-emitting portion, 9410: display device, 9411: housing, 9412: display portion, 9413: operation button, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker, 9885: operation key, 9886: recording medium insertion portion, 9887: connection terminal, 9888: sensor, 9889: microphone, 9890: LED lamp, 9891: housing, 9893: joint portion, 9900: slot machine, 9901: housing, 9903: display portion

The invention claimed is:

1. A method of forming a semiconductor device comprising a first transistor, a second transistor, a third transistor, a fourth transistor, a fifth transistor, and a sixth transistor each comprising an oxide semiconductor in a channel formation region, wherein an oxide semiconductor layer of the first transistor, an oxide semiconductor layer of the second transistor, an oxide semiconductor layer of the third transistor, an oxide semiconductor layer of the fourth transistor, an oxide semiconductor layer of the fifth transistor, and an oxide semiconductor layer of the sixth transistor are formed through a step of supplying oxygen to the oxide semiconductor in the channel formation region after dehydration or dehydrogenation treatment applied to the oxide semiconductor, wherein the oxide semiconductor comprises crystalline grains, wherein one of a source and a drain of the first transistor is electrically connected to a gate of the fourth transistor, wherein one of a source and a drain of the second transistor is electrically connected to the gate of the fourth transistor, wherein one of a source and a drain of the third transistor is electrically connected to a gate of the fifth transistor, wherein one of a source and a drain of the fourth transistor is electrically connected to the gate of the fifth transistor, wherein one of a source and a drain of the fifth transistor is electrically connected to a first wiring, wherein one of a source and a drain of the sixth transistor is electrically connected to the first wiring, wherein a gate of the second transistor is electrically connected to a second wiring, wherein a gate of the third transistor is electrically connected to the second wiring, wherein a gate of the sixth transistor is electrically connected to the gate of the fourth transistor, wherein the other of the source and the drain of the first transistor is electrically connected to the other of the source and the drain of the third transistor, and wherein the other of the source and the drain of the fifth transistor is electrically connected to a third wiring.

2. A method of forming a semiconductor device comprising a first transistor, a second transistor, a third transistor, a fourth transistor, a fifth transistor, and a sixth transistor each comprising an oxide semiconductor in a channel formation region, wherein an oxide semiconductor layer of the first transistor, an oxide semiconductor layer of the second transistor, an oxide semiconductor layer of the third transistor, an oxide semiconductor layer of the fourth transistor, an oxide semiconductor layer of the fifth transistor, and an oxide semiconductor layer of the sixth transistor are formed through a step of supplying oxygen to the oxide semiconductor in the channel formation region after dehydration or dehydrogenation treatment applied to the oxide semiconductor, wherein the oxide semiconductor comprises crystalline grains, wherein one of a source and a drain of the first transistor is electrically connected to a gate of the fourth transistor, wherein one of a source and a drain of the second transistor is electrically connected to the gate of the fourth transistor, wherein one of a source and a drain of the third transistor is electrically connected to a gate of the fifth transistor, wherein one of a source and a drain of the fourth transistor is electrically connected to the gate of the fifth transistor, wherein one of a source and a drain of the fifth transistor is electrically connected to a first wiring, wherein one of a source and a drain of the sixth transistor is electrically connected to the first wiring, wherein a gate of the second transistor is electrically connected to a second wiring, wherein a gate of the third transistor is electrically connected to the second wiring, wherein a gate of the sixth transistor is electrically connected to the gate of the fourth transistor, wherein the other of the source and the drain of the first transistor is electrically connected to the other of the source and the drain of the third transistor, wherein the other of the source and the drain of the fifth transistor is electrically connected to a third wiring, wherein a first signal is outputted via the first wiring, wherein a second signal is input to the second wiring, and wherein a clock signal is input to the third wiring.

3. The method of forming a semiconductor device according to claim 1, wherein the oxide semiconductor comprises indium and zinc.

4. The method of forming a semiconductor device according to claim 1, wherein the first transistor is formed by performing a first heat treatment and a second heat treatment after forming the oxide semiconductor layer of the first transistor.

5. The method of forming a semiconductor device according to claim 4, wherein the first heat treatment is performed after forming the oxide semiconductor layer of the first transistor and before forming the source and the drain of the first transistor, wherein the second heat treatment is performed in a state where a first insulating layer containing oxygen and silicon is in contact with an upper surface of the oxide semiconductor layer of the first transistor, the source and the drain of the first transistor, wherein a temperature of the first heat treatment is higher than or equal to 425° C. and lower than or equal to 750° C., and wherein a temperature of the second heat treatment is higher than or equal to 200° C. and lower than or equal to 400° C.

6. The method of forming a semiconductor device according to claim 2, wherein the oxide semiconductor comprises indium and zinc.

7. The method of forming a semiconductor device according to claim 2, wherein the first transistor is formed by performing a first heat treatment and a second heat treatment after forming the oxide semiconductor layer of the first transistor.

8. The method of forming a semiconductor device according to claim 7, wherein the first heat treatment is performed after forming the oxide semiconductor layer of the first transistor and before forming the source and the drain of the first transistor, wherein the second heat treatment is performed in a state where a first insulating layer containing oxygen and silicon is in contact with an upper surface of the oxide semiconductor layer of the first transistor, the source and the drain of the first transistor, wherein a temperature of the first heat treatment is higher than or equal to 425° C. and lower than or equal to 750° C., and wherein a temperature of the second heat treatment is higher than or equal to 200° C. and lower than or equal to 400° C.

9. The method of forming a semiconductor device according to claim 1, wherein a crystallinity of the oxide semiconductor is 80% or more.

10. The method of forming a semiconductor device according to claim 2, wherein a crystallinity of the oxide semiconductor is 80% or more.

* * * * *